US012612528B2

(12) United States Patent
Welch et al.

(10) Patent No.: US 12,612,528 B2
(45) Date of Patent: Apr. 28, 2026

(54) ORGANOVOLTAIC MATERIALS AND USES THEREOF

(71) Applicant: BRILLIANT MATTERS ORGANIC ELECTRONICS INC., St-Augustin-de-Desmaures (CA)

(72) Inventors: Gregory C. Welch, Calgary (CA); Mahmoud E. Farahat, Calgary (CA); Sergey V. Dayneko, Calgary (CA); Philippe Berrouard, Québec (CA); Pierre-Olivier Morin, Québec (CA)

(73) Assignee: BRILLIANT MATTERS ORGANIC ELECTRONICS INC., St-Augustin-de-Desmaures (CA)

( * ) Notice: Subject to any disclaimer, the term of this patent is extended or adjusted under 35 U.S.C. 154(b) by 177 days.

(21) Appl. No.: 18/026,540

(22) PCT Filed: Sep. 16, 2021

(86) PCT No.: PCT/CA2021/051294

§ 371 (c)(1),
(2) Date: Mar. 15, 2023

(87) PCT Pub. No.: WO2022/056636

PCT Pub. Date: Mar. 24, 2022

(65) Prior Publication Data

US 2023/0403925 A1 Dec. 14, 2023

Related U.S. Application Data

(60) Provisional application No. 63/079,147, filed on Sep. 16, 2020.

(51) Int. Cl.

| | |
|---|---|
| ***C09D 11/52*** | (2014.01) |
| ***H10K 30/30*** | (2023.01) |
| ***H10K 85/10*** | (2023.01) |
| ***H10K 85/20*** | (2023.01) |
| *H10K 30/50* | (2023.01) |

(52) U.S. Cl.

CPC ............. *C09D 11/52* (2013.01); *H10K 30/30* (2023.02); *H10K 85/113* (2023.02); *H10K 85/215* (2023.02); *H10K 30/50* (2023.02)

(58) Field of Classification Search

None

See application file for complete search history.

(56) References Cited

U.S. PATENT DOCUMENTS

| | | | | |
|---|---|---|---|---|
| 10,647,732 | B2 | 5/2020 | Welch et al. | |
| 2015/0361223 | A1* | 12/2015 | Woo ..................... | H10K 85/113 136/263 |
| 2019/0393423 | A1* | 12/2019 | Yan ..................... | H10K 85/621 |

FOREIGN PATENT DOCUMENTS

| | | |
|---|---|---|
| CN | 111217989 A | 6/2020 |

OTHER PUBLICATIONS

Mainville et al. "Water Copatible Direct (Hetero)arylation Polymerization of PPDT2FBT: A Pathway Towards Large-Scale Production of Organic Solar Cells" (2020).*

Dayneko et al "Indoor Photovoltaics: Photoactive Material Selection, Greener Ink Formulations, and Slot-Die coated Active Layers" (2019).*

Steim, R. et al., "Organic Photovoltaics for Low Light Applications", Sol. Energy Mater. Sol. Cells, 2011, 95 (12), 3256-3261.

Freitag, M. et al., "Dye-Sensitized Solar Cells for Efficient Power Generation under Ambient Lighting", Nat. Photonics, 2017, 11 (6), 372-378.

Chen, C.-Y.; et al., "Vacuum-Deposited Perovskite Photovoltaics for Highly Efficient Environmental Light Energy Harvesting", J. Mater. Chem. A, 2019, 7 (8), 3612-3617.

Ding, Z. et al., "All-Polymer Indoor Photovoltaics with High Open-Circuit Voltage", J. Mater. Chem. A, 2019.

Cui, Y. et al., "Single-Junction Organic Photovoltaic Cells with Approaching 18% Efficiency", Adv. Mater., 2020, 32, 1908205.

Farahat, M. E. et al., "Efficient Molecular Solar Cells Processed from Green Solvent Mixtures", J. Mater. Chem. A, 2017, 5 (2), 571-582.

Wai Ho, J. K. et al., "From 33% to 57%—an Elevated Potential of Efficiency Limit for Indoor Photovoltaics", J. Mater. Chem. A, 2020, 8 (4), 1717-1723.

Shin, S.-C. et al., "Ultra-Thick Semi-Crystalline Photoactive Donor Polymer for Efficient Indoor Organic Photovoltaics", Nano Energy, 2019, 58, 466-475.

Dayneko, S. V. et al., "Combining Facile Synthetic Methods with Greener Processing for Efficient Polymer-Perylene Diimide Based Organic Solar Cells", Small Methods, 2018, 2 (6), 1800081.

(Continued)

*Primary Examiner* — Austin Murata

(74) *Attorney, Agent, or Firm* — Lavery, de Billy, L.L.P.; Alain Dumont

(57) ABSTRACT

Organic photovoltaics (OPVs) based on a slot-die coated ternary blends for low-intensity light harvesting are disclosed herein. The ternary blends comprise either a N-annulated perylene diimide-based electron acceptor material or an aalkyl-12,13-dihydro[1,2,5] thiadiazolo[3,4e]thieno[2",3":4',5] thieno[2',3':4,5] pyrrolo[3,2-g] thieno [2',3':4,5] thieno [3,2-b]indole-2,10-diyl)bis(methanylylidene)) bis(3-oxo-2,3-dihydro1H-indene-2,1-diylidene))dimalononitrile) (BTP)-based electron acceptor material, a second acceptor material, and an electron donor material which comprises poly[(2,5-bis(2-hexyldecyloxy) phenylene)-alt-(5,6-difluoro-4,7-di(thiophen-2-yl)benzo[c] [1,2,5]thiadiazole)] (PPDT2FBT). In an aspect, a N-annulated perylene diimide dimer (tPDI$_2$N-EH, PDI) acceptor material was incorporated into a blend of donor polymer material (PPDT2FBT) and fullerene acceptor [6,6]-phenyl-C$_{61}$-butyric acid methyl ester (PC$_{61}$BM) material to give ternary bulk heterojunction (BHJ) blends. In a further aspect, a BTP-based electron acceptor material was incorporated into a blend of donor polymer material (PPDT2FBT) and fullerene acceptor [6,6]-phenyl-C$_{61}$-butyric acid methyl ester (PC$_{61}$BM) material to give ternary bulk heterojunction (BHJ) blends.

20 Claims, 14 Drawing Sheets

(56) References Cited

OTHER PUBLICATIONS

Tintori, F. et al., "Perylene Diimide Based Organic Photovoltaics with Slot-Die Coated Active Layers from Halogen-Free Solvents in Air at Room Temperature", ACS Appl. Mater. Interfaces, 2019, 11 (42), 39010-39017.
Laventure, A. et al., "Screening Quinoxaline-Type Donor Polymers for Roll-to-Roll Processing Compatible Organic Photovoltaics", ACS Appl. Polym. Mater., 2019, 1 (8), 2168-2176.
Abd-Ellah, M. et al., "Interfacial ZnO Modification Using a Carboxylic Acid Functionalized NAnnulated Perylene Diimide for Inverted Type Organic Photovoltaics", ACS Appl. Electron. Mater., 2019, 1 (8), 1590-1596.
Dayneko, S. V. et al., "Ternary Organic Solar Cells: Using Molecular Donor or Acceptor Third Components to Increase Open Circuit Voltage", New J. Chem., 2019, 43 (26), 10442-10448.
Dayneko, S. V. et al., "Indoor Photovoltaics: Photoactive Material Selection, Greener Ink Formulations, and Slot-Die Coated Active Layers", ACS Appl. Mater. Interfaces, 2019, 11 (49), 46017-46025.
Hendsbee, A. D. et al., "Synthesis, Self-Assembly, and Solar Cell Performance of N-Annulated Perylene Diimide Non-Fullerene Acceptors", Chem. Mater., 2016, 28 (19), 7098-7109.
Singh, R. et al., "Ternary Blend Strategy for Achieving High-Efficiency Organic Photovoltaic Devices for Indoor Applications", Chem. Euro. J., 2019, 25 (24), 6154-6161.
Zhang, Y. et al., "Current Status of Outdoor Lifetime Testing of Organic Photovoltaics", Adv. Sci., 2018, 5, 1800434.
Wang, K. et al. "Over 7% photovoltaic efficiency of a semicrystalline donor-acceptor polymer synthesized via direct arylation polymerization", Dyes and Pigments, 2018, 158, pp. 183-187.
Qureshi, M. B. A. et al., "Nonfullerene acceptors with an N-annulated perylene core and two perylene diimide units for efficient organic solar cells", Dyes and Pigments, 2020, 173, 107970, 7 pages.
Castner, E. W. Jr. et al., "Solvent as Electron Donor: Donor/Acceptor Electronic Coupling Is a Dynamical Variable", J. Phys. Chem. A, 2000, 104, pp. 2869-2885.
International Search Report and Written Opinion dated Dec. 10, 2021, issued in corresponding International Patent Application No. PCT/CA2021/051294, 15 pages.
Yunpeng Qin et al., "Low Temperature Aggregation Transitions in N3 and Y6 Acceptors Enable Double-Annealing Method That Yields Hierarchical Morphology and Superior Efficiency in Nonfullerence Organic Solar Cells", Advanced Functional Materials, Wiley—V C H Verlag GMBH & Co. KGAA, DE, vol. 30, No. 46 (Sep. 9, 2020).
European Search Report dated Sep. 12, 2024, issued in corresponding European Patent Application No. 21867990.0.
1 Examination Report dated Oct. 21, 2025, issued in corresponding Japanese Patent Application No. 2023-540982.

* cited by examiner (a)

$PC_{61}BM$

PDI

FBT (b)

(c)

(d)

Binary, RMS= 1.12 nm        10% PDI, RMS= 1.11 nm        20% PDI, RMS= 1.18 nm

30% PDI, RMS= 1.45 nm        40% PDI, RMS= 1.56 nm        50% PDI, RMS= 1.69 nm

ORGANOVOLTAIC MATERIALS AND USES THEREOF

CROSS REFERENCE TO RELATED APPLICATIONS

This application claims the benefit of U.S. Provisional Application 63/079,147, filed Sep. 16, 2020. The contents of the referenced application are incorporated into the present application by reference.

FIELD

The present disclosure broadly relates to novel organovoltaic materials and uses thereof. More specifically but not exclusively, the present disclosure relates to novel slot-die coated and spin coated ternary blends for low intensity indoor light harvesting. Yet more specifically but not exclusively, the present disclosure relates to novel organovoltaic materials based on ternary bulk heterojunction (BHJ) blends. The present disclosure also relates to a process for the preparation of novel organovoltaic materials based on ternary bulk heterojunction (BHJ) blends. Moreover, the present disclosure relates to the use of the novel organovoltaic materials in organic electronics.

BACKGROUND

Indoor photovoltaics (iPVs) target the harvesting of artificial light and are expected to play a vital role as a power supply source for Internet of Things (IoT) systems. One immediate market entry point for iPVs is powering small electronic devices, as tens of billions of these devices are expected to be installed within the coming decade. Indoor light intensities in the range of 500 lux (office spaces) and 1000 lux (factories) are sufficient to provide >100 μW power when using small iPVs modules. This power is enough to supply smart IoT devices such as radio frequency identification (RFID) tags (~10 μW), ecobee thermostats (~18 μW), and passive WiFi (~60 μW). Critical to iPV deployment are the following: i) bandgap engineering of the active layer—employing photoactive materials with medium bandgaps (visible range light absorption) to match the emission of LED lighting; ii) high $V_{oc}$ values to offset the voltage loss under low-light intensity;[1] and iii) vetting device performance at scale.

To the first point, various photoactive materials lend feasibility towards iPVs, including dye-sensitized,[2] perovskite,[3] and organic,[4] semiconductors. Of these, organic photovoltaics (OPVs) stand out as ideal candidates for indoor light recycling applications for a number of reasons. In terms of feasibility, the power conversion efficiency (PCE) of OPV devices has reached 18% for single junction cells under 1 sun illumination (AM 1.5G, 100 $mW/cm^2$).[5] OPVs have active layers constructed from organic chromophores with high exciton coefficients in the visible region of the electromagnetic spectrum (i.e., overlapping with the emission spectra of artificial indoor lights). OPVs can be easily solution processed from halogen-free solvents,[6] onto lightweight substrates and adapted to a variety of form factors. Moreover, OPVs have a high compatibility with various coating techniques such as blade coating and slot-die coating, which is ideal for large scale manufacturing.

Compared to inorganic photovoltaics, OPVs have lower PCEs under 1 sun illumination. However, due to their highly tunable optical absorption and small current leakage under low light intensities, OPVs have shown efficient performance in harvesting indoor light energy more than inorganic technologies. Small current leakage can enable thicker active layers with higher fill factor (FF), which is crucial for large-scale production. Moreover, due to the low impact of series resistance on the performance of OPVs under dim lighting, replacement of the common indium tin oxide (ITO) electrode becomes feasible enabling the use of lower cost and sustainable transparent conducting electrodes.

Proof-of-concept iOPVs (indoor organic photovoltaics) have been established for charging of a super-capacitor and wireless sensor nodes. Despite this, the performance of OPV devices under indoor light illumination is still far from the theoretical maximum PCE values (~51-57%),[7] warranting further investigation and optimization.

A binary blend system composed of semi-crystalline poly[(2,5-bis(2-hexyldecyloxy) phenylene)-alt-(5,6-difluoro-4,7-di(thiophen-2-yl)benzo[c][1,2,5]thiadiazole)] (PPDT2FBT, herein referred to as FBT) and [6,6]-phenyl-$C_{71}$-butyric acid methyl ester ($PC_{71}BM$) has recently been reported. An OPV device with a PCE of 9%, and having thick active layers (~300 nm), and exhibiting high thermal stability was obtained. The active layer was readily processed via slot-die coating—a roll-to-roll compatible technique—resulting in a device PCE of 7.5% under 1 sun. Evaluation under LED illumination (1000 lux) showed a PCE increase to 16%.[8] The use of this FBT:fullerene photoactive layer for iOPV construction using the ternary blend approach has been reported. Ternary blends have been previously used for enhancing device photocurrent generation via increasing spectral matching, increasing the device $V_{oc}$≥1V by energy cascading to minimize loss processes, and controlling active layer morphology for enhanced transport over recombination.

The use of a N-annulated perylene diimide dimer $tPDI_2N$-EH (PDI) as a non-fullerene acceptor (NFA) in both binary[9-12] and ternary[13] OPVs has been reported. Devices based on FBT:PDI (active layers slot-die coated from o-xylene) exhibited high $V_{oc}$ values of 1.02 V and 0.84 V under 1 sun and 1000 lux illumination, respectively, with PCEs of 4% and 9% in each case.[14] In contrast, OPVs with FBT:$PC_{61}BM$ active layers had PCEs of 8% and 14% under 1 sun and 1000 lux illumination, respectively, but with $V_{oc}$ values of 0.78 V or less.[14] Moreover, PDI has been reported as being capable of significantly raising the $V_{oc}$ of PBDB-T:$PC_{61}BM$ based OPVs when used as a third component.[13]

SUMMARY

The present disclosure broadly relates to novel organovoltaic materials and uses thereof. More specifically but not exclusively, the present disclosure relates to novel slot-die coated and spin coated ternary blends for low intensity indoor light harvesting. Yet more specifically but not exclusively, the present disclosure relates to novel organovoltaic materials based on ternary bulk heterojunction (BHJ) blends. The present disclosure also relates to a process for the preparation of novel organovoltaic materials based on ternary bulk heterojunction (BHJ) blends. Moreover, the present disclosure relates to the use of the novel organovoltaic materials in organic electronics.

A solution to the problems associated with the performance of current OPV devices under indoor light illumination has been discovered. Broadly, the solution resides in the discovery of ternary blends comprising an electron donor material and at least two electron acceptor materials. In an aspect, the present disclosure relates to a ternary blend composed of an electron donor material, a N-annulated perylene diimide-based electron acceptor material, and at least a second electron acceptor material. In a further aspect, the present disclosure relates to a ternary blend composed of an electron donor material, an alkyl-12,13-dihydro[1,2,5] thiadiazolo[3,4e]thieno[2",3":4',5'] thieno[2',3':4,5] pyrrolo [3,2-g] thieno [2',3':4,5]thieno[3,2-b]indole-2,10-diyl)bis (methanylylidene)) bis(3-oxo-2,3-dihydro1H-indene-2,1-diylidene))dimalononitrile) (BTP)-based electron acceptor material, and at least a second electron acceptor material. These ternary blends can be used in OPVs for efficient indoor light harvesting. One benefit of the ternary blends is that they can be efficiently slot-die coated from environmentally friendly solvents (e.g., halogen-free solvents) paving the way to large-area efficient OPVs for indoor light recycling applications.

In an aspect, the present disclosure relates to a composition comprising a blend of at least two electron acceptor materials $A_1$ and $A_2$, and at least an electron donor material $D_1$, wherein one of the electron acceptor materials is a N-annulated perylene diimide-based electron acceptor material. In an embodiment of the present disclosure, the N-annulated perylene diimide-based electron acceptor material comprises PDI. In an embodiment of the present disclosure, the PDI may be a monomer or a dimer. In an aspect, the present disclosure relates to a ternary blend comprising a N-annulated perylene diimide-based electron acceptor material, a second acceptor material, and an electron donor material. In an embodiment of the present disclosure, the N-annulated perylene diimide-based electron acceptor material comprises PDI. In an embodiment of the present disclosure, the PDI may be a monomer or a dimer. In an embodiment of the present disclosure, the mass ratio (w/w) of the donor material and the acceptor materials can be from about 1:1.0 to about 1:2.0, for example from about 1:1.1 to about 1:1.9, for example from about 1:1.2 to about 1:1.8, for example from about 1:1.3 to about 1:1.7, for example from about 1:1.4 to about 1:1.6, or any range derivable therein. In a particular embodiment, the ternary blend comprises a donor:acceptor ratio (w/w) of about 1:1.5. In a further embodiment of the present disclosure, the ternary blend is slot-die coated from environmentally friendly solvents (e.g., halogen-free solvents).

In an aspect, the present disclosure relates to a ternary blend comprising a N-annulated perylene diimide-based electron acceptor material, a second electron acceptor material, and an electron donor material. In an embodiment of the present disclosure, the N-annulated perylene diimide-based electron acceptor material comprises PDI. In an embodiment of the present disclosure, the PDI may be a monomer or a dimer. In an embodiment of the present disclosure, the ternary blend comprises FBT:$PC_{61}$BM:PDI. In a further embodiment of the present disclosure, the ternary blend comprises a weight ratio for FBT:$PC_{61}$BM:PDI of about 1:1.35:0.15. In a further embodiment of the present disclosure, the ternary blend comprises a weight ratio for FBT:$PC_{61}$BM:PDI of about 1:1.2:0.3. In a further embodiment of the present disclosure, the ternary blend comprises a weight ratio for FBT:$PC_{61}$BM:PDI of about 1:1.05:0.45. In a further embodiment of the present disclosure, the ternary blend comprises a weight ratio for FBT:$PC_{61}$BM:PDI of about 1:0.9:0.6. In a further embodiment of the present disclosure, the ternary blend comprises a weight ratio for FBT:$PC_{61}$BM:PDI of about 1:0.75:0.75. In an aspect of the present disclosure, the ternary blend further comprises an additive. In an embodiment, the additive comprises from about 0.1 wt. % to about 5 wt. % of the ternary blend. In a further embodiment, the additive comprises about 1 wt. % of the ternary blend. In yet a further embodiment, the additive comprises at least one of p-anisaldehyde (AA) or diphenyl ether (DPE). In a further embodiment of the present disclosure, the ternary blend is slot-die coated from environmentally friendly solvents (e.g., halogen-free solvents).

In an aspect, the present disclosure relates to a ternary blend comprising a N-annulated perylene diimide-based electron acceptor material, a second electron acceptor material, and an electron donor material. In an embodiment of the present disclosure, the ternary blend comprises FBT:$PC_{61}$BM:PDI. In a further aspect of the present disclosure, the ternary blend materials exhibit band gaps sufficiently matching the full indoor LED emission spectrum.

In an aspect, the present disclosure relates to a composition comprising a blend of at least two electron acceptor materials $A_1$ and $A_2$, and at least an electron donor material $D_1$, wherein one of the electron acceptor materials is an alkyl-12,13-dihydro [1,2,5]thiadiazolo[3,4e]thieno[2",3":4',5'] thieno[2',3':4,5]pyrrolo[3,2-g] thieno[2',3':4,5] thieno[3,2-b]indole-2,10-diyl)bis(methanylylidene))bis(3-oxo-2,3-dihydro1H-indene-2,1-diylidene)) dimalononitrile) (BTP)-based electron acceptor material. In an aspect, the present disclosure relates to a ternary blend comprising an alkyl-12,13-dihydro[1,2,5]thiadiazolo[3,4e]thieno[2",3":4',5'] thieno[2',3':4,5]pyrrolo[3,2-g] thieno [2',3':4,5]thieno[3,2-b] indole-2,10-diyl)bis(methanylylidene))bis(3-oxo-2,3-dihydro1H-indene-2,1-diylidene))dimalononitrile) (BTP)-based electron acceptor material, a second acceptor material, and an electron donor material. In an embodiment of the present disclosure, the mass ratio (w/w) of the donor material and the acceptor materials can be from about 1:1.0 to about 1:2.0, for example from about 1:1.1 to about 1:1.9, for example from about 1:1.2 to about 1:1.8, for example from about 1:1.3 to about 1:1.7, for example from about 1:1.4 to about 1:1.6, or any range derivable therein. In a particular embodiment, the ternary blend comprises a donor:acceptor ratio (w/w) of about 1:1.5. In a further embodiment of the present disclosure, the ternary blend is slot-die coated from environmentally friendly solvents (e.g., halogen-free solvents).

In an aspect, the present disclosure relates to a ternary blend comprising an alkyl-12,13-dihydro[1,2,5]thiadiazolo [3,4e]thieno[2",3":4',5'] thieno[2',3':4,5]pyrrolo[3,2-g] thieno[2',3':4,5]thieno[3,2-b]indole-2,10-diyl)bis(methanylylidene))bis(3-oxo-2,3-dihydro1H-indene-2,1-diylidene)) dimalononitrile) (BTP)-based electron acceptor material, a second electron acceptor material, and an electron donor material. In an embodiment of the present disclosure, the ternary blend comprises FBT:$PC_{61}$BM:BTP. In a further embodiment of the present disclosure, the ternary blend comprises a weight ratio for FBT:$PC_{61}$BM:BTP of about 1:1.35:0.15. In a further embodiment of the present disclosure, the ternary blend comprises a weight ratio for FBT:$PC_{61}$BM:BTP of about 1:1.2:0.3. In a further embodiment of the present disclosure, the ternary blend comprises a weight ratio for FBT:$PC_{61}$BM:BTP of about 1:1.05:0.45. In a further embodiment of the present disclosure, the ternary blend comprises a weight ratio for FBT:$PC_{61}$BM:PDI of about 1:0.9:0.6. In a further embodiment of the present disclosure, the ternary blend comprises a weight ratio for FBT:$PC_{61}$BM:BTP of about 1:0.75:0.75. In an aspect of the present disclosure, the ternary blend further comprises an additive. In an embodiment, the additive comprises from about 0.1 wt. % to about 5 wt. % of the ternary blend. In a further embodiment, the additive comprises about 1 wt. % of the ternary blend. In yet a further embodiment, the additive comprises at least one of p-anisaldehyde (AA) or diphenyl ether (DPE). In a further embodiment of the present disclosure, the ternary blend is slot-die coated from environmentally friendly solvents (e.g., halogen-free solvents).

In an aspect, the present disclosure relates to a ternary blend comprising an alkyl-12,13-dihydro[1,2,5]thiadiazolo [3,4e]thieno[2",3":4',5'] thieno[2',3':4,5]pyrrolo[3,2-g] thieno[2',3':4,5]thieno[3,2-b]indole-2,10-diyl)bis(methanylylidene))bis(3-oxo-2,3-dihydro1H-indene-2,1-diylidene)) dimalononitrile) (BTP)-based electron acceptor material, a second electron acceptor material, and an electron donor material. In an embodiment of the present disclosure, the ternary blend comprises FBT:$PC_{61}$BM:BTP. In a further aspect of the present disclosure, the ternary blend materials exhibit band gaps sufficiently matching the full indoor LED emission spectrum.

In an aspect, the present disclosure relates to a photoactive layer for iOPV construction having high thermal stability, thickness tolerance, and strong visible light absorption. In an embodiment, the photoactive layer comprises a ternary blend comprising a N-annulated perylene diimide-based electron acceptor material, a second electron acceptor material, and an electron donor material. In an embodiment of the present disclosure, the ternary blend comprises FBT:$PC_{61}$BM:PDI. In a further embodiment, the photoactive layer comprises a ternary blend comprising an alkyl-12,13-dihydro[1,2,5] thiadiazolo [3,4e]thieno[2",3":4',5] thieno[2',3':4,5] pyrrolo[3,2-g] thieno[2',3':4,5]thieno[3,2-b]indole-2,10-diyl)bis(methanylylidene)) bis(3-oxo-2,3-dihydro1H-indene-2,1-diylidene)) dimalononitrile) (BTP)-based electron acceptor material, a second electron acceptor material, and an electron donor material. In a further embodiment of the present disclosure, the ternary blend comprises FBT:$PC_{61}$BM:BTP. In yet a further embodiment of the present disclosure, the ternary blend is slot-die coated from environmentally friendly solvents (e.g., halogen-free solvents).

In an aspect, the present disclosure relates to the use of a ternary blend comprising a N-annulated perylene diimide-based electron acceptor material, a second electron acceptor material, and an electron donor material, for enhancing device photocurrent generation. In an embodiment of the present disclosure, the ternary blend comprises FBT:$PC_{61}$BM:PDI. In an embodiment of the present disclosure the device is an iPV. In an embodiment, the iPV can be effectively integrated with IoT-based devices.

In an aspect, the present disclosure relates to the use of a ternary blend comprising an alkyl-12,13-dihydro[1,2,5]thiadiazolo[3,4e]thieno[2",3":4',5'] thieno[2',3':4,5] pyrrolo[3,2-g] thieno[2',3':4,5]thieno[3,2-b]indole-2,10-diyl) bis(methanylylidene)) bis(3-oxo-2,3-dihydro1H-indene-2,1-diylidene))dimalononitrile) (BTP)-based electron acceptor material, a second electron acceptor material, and an electron donor material, for enhancing device photocurrent generation. In an embodiment of the present disclosure, the ternary blend comprises FBT:$PC_{61}$BM:BTP. In an embodiment of the present disclosure the device is an iPV. In an embodiment, the iPV can be effectively integrated with IoT-based devices.

In an aspect, the present disclosure relates to the use of a ternary blend comprising a N-annulated perylene diimide-based electron acceptor material, a second electron acceptor material, and an electron donor material, for enhancing device photocurrent generation. In an embodiment of the present disclosure, the ternary blend comprises FBT:$PC_{61}$BM:PDI. In an embodiment of the present disclosure the device is an OPV used for indoor light recycling.

In an aspect, the present disclosure relates to the use of a ternary blend comprising an alkyl-12,13-dihydro[1,2,5]thiadiazolo[3,4e]thieno[2",3":4',5'] thieno[2',3':4,5] pyrrolo[3,2-g] thieno[2',3':4,5]thieno[3,2-b]indole-2,10-diyl)bis(methanylylidene))bis(3-oxo-2,3-dihydro1H-indene-2,1-diylidene))dimalononitrile) (BTP)-based electron acceptor material, a second electron acceptor material, and an electron donor material, for enhancing device photocurrent generation. In an embodiment of the present disclosure, the ternary blend comprises FBT:$PC_{61}$BM:BTP. In an embodiment of the present disclosure the device is an OPV used for indoor light recycling.

In an aspect, the present disclosure relates to the use of a ternary blend comprising a N-annulated perylene diimide-based electron acceptor material, a second electron acceptor material, and an electron donor material, as an organic semiconductor material, layer or component.

In an aspect, the present disclosure relates to the use of a ternary blend comprising an alkyl-12,13-dihydro[1,2,5]thiadiazolo[3,4e]thieno[2",3":4',5'] thieno[2',3':4,5] pyrrolo[3,2-g] thieno[2',3':4,5]thieno[3,2-b]indole-2,10-diyl)bis(methanylylidene))bis(3-oxo-2,3-dihydro1H-indene-2,1-diylidene))dimalononitrile) (BTP)-based electron acceptor material, a second electron acceptor material, and an electron donor material, as an organic semiconductor material, layer or component.

In an aspect, the present disclosure relates to an electronic device comprising a ternary blend comprising a N-annulated perylene diimide-based electron acceptor material, a second electron acceptor material, and an electron donor material. In an embodiment of the present disclosure, the electronic device is an OPV device. In a further embodiment of the present disclosure, the OPV is used for indoor light harvesting.

In an aspect, the present disclosure relates to an electronic device comprising a ternary blend comprising an alkyl-12,13-dihydro[1,2,5]thiadiazolo[3,4e]thieno[2",3":4',5] thieno[2',3':4,5]pyrrolo[3,2-g] thieno[2',3':4,5]thieno[3,2-b]indole-2,10-diyl)bis(methanylylidene)) bis(3-oxo-2,3-dihydro1H-indene-2,1-diylidene))dimalononitrile) (BTP)-based electron acceptor material, a second electron acceptor material, and an electron donor material. In an embodiment of the present disclosure, the electronic device is an OPV device. In a further embodiment of the present disclosure, the OPV is used for indoor light harvesting.

Disclosed in the context of the present disclosure are embodiments 1 to 90. Embodiment 1 is a composition comprising a blend of at least two electron acceptor materials $A_1$ and $A_2$, and at least an electron donor material $D_1$, wherein one of the electron acceptor materials is a N-annulated perylene diimide-based electron acceptor material. Embodiment 2 is a composition comprising a blend of at least two electron acceptor materials $A_1$ and $A_2$, and at least one electron donor material $D_1$, wherein the at least one electron donor material $D_1$ comprises poly[(2,5-bis(2-hexyldecyloxy) phenylene)-alt-(5,6-difluoro-4,7-di(thiophen-2-yl)benzo[c][1,2,5]thiadiazole)] (PPDT2FBT), and wherein one of the at least two electron acceptor materials $A_1$ and $A_2$ comprises a N-annulated perylene diimide-based electron acceptor material or an alkyl-12,13-dihydro[1,2,5] thiadiazolo [3,4e]thieno[2",3":4',5'] thieno[2',3':4,5] pyrrolo[3,2-g] thieno[2',3':4,5]thieno[3,2-b]indole-2,10-diyl)bis(methanylylidene)) bis(3-oxo-2,3-dihydro1H-indene-2,1-diylidene)) dimalononitrile) (BTP)-based electron acceptor material. Embodiment 3 is the composition of embodiment 1 or 2, wherein the blend is a ternary blend comprising a N-annulated perylene diimide-based electron acceptor material, a second electron acceptor material, and an electron donor material comprising PPDT2FBT. Embodiment 4 is the composition of embodiment 1 or 2, wherein the blend is a ternary blend comprising a BTP-based electron acceptor material, a second electron acceptor material, and an electron donor material comprising PPDT2FBT. Embodiment 5 is the composition of embodiment 3 or 4, wherein the blend comprises a mass ratio (w/w) of donor material to acceptor material ranging from about 1:1.0 to about 1:2.0. Embodiment 6 is the composition of embodiment 5, wherein the mass ratio (w/w) of donor material to acceptor material ranges from about 1:1.1 to about 1:1.9. Embodiment 7 is the composition of embodiment 6, wherein the mass ratio (w/w) of donor material to acceptor material ranges from about 1:1.2 to about 1:1.8. Embodiment 8 is the composition of embodiment 7, wherein the mass ratio (w/w) of donor material to acceptor material ranges from about 1:1.3 to about 1:1.7. Embodiment 9 is the composition of embodiment 8, wherein the mass ratio (w/w) of donor material to acceptor material ranges from about 1:1.4 to about 1:1.6. Embodiment 10 is the composition of embodiment 9, wherein the mass ratio (w/w) of donor material to acceptor material is about 1:1.5. Embodiment 11 is the composition of any one of embodiments 5 to 10, wherein the blend comprises FBT:$PC_{61}$BM:PDI. Embodiment 12 is the composition of embodiment 11, wherein the mass ratio (w/w) of FBT:$PC_{61}$BM:PDI is about 1:1.35:0.15. Embodiment 13 is the composition of embodiment 11, wherein the mass ratio (w/w) of FBT:$PC_{61}$BM:PDI is about 1:1.2:0.3. Embodiment 14 is the composition of embodiment 11, wherein the mass ratio (w/w) of FBT:$PC_{61}$BM:PDI is about 1:1.05:0.45. Embodiment 15 is the composition of embodiment 11, wherein the mass ratio (w/w) of FBT:$PC_{61}$BM:PDI is about 1:0.9:0.6. Embodiment 16 is the composition of embodiment 11, wherein the mass ratio (w/w) of FBT:$PC_{61}$BM:PDI is about 1:0.75:0.75. Embodiment 17 is the composition of any one of embodiments 5 to 10, wherein the blend comprises FBT:$PC_{61}$BM:BTP. Embodiment 18 is the composition of embodiment 17, wherein the mass ratio (w/w) of FBT:$PC_{61}$BM:BTP is about 1:1.35:0.15. Embodiment 19 is the composition of embodiment 17, wherein the mass ratio (w/w) of FBT:$PC_{61}$BM:BTP is about 1:1.2:0.3. Embodiment 20 is the composition of embodiment 17, wherein the mass ratio (w/w) of FBT:$PC_{61}$BM:BTP is about 1:1.05:0.45. Embodiment 21 is the composition of embodiment 17, wherein the mass ratio (w/w) of FBT:$PC_{61}$BM:BTP is about 1:0.9:0.6. Embodiment 22 is the composition of embodiment 17, wherein the mass ratio (w/w) of FBT:$PC_{61}$BM:BTP is about 1:0.75:0.75. Embodiment 23 is the composition of any one of embodiments 1 to 22, wherein the blend further comprising an additive. Embodiment 24 is the composition of embodiment 23, wherein the additive comprises from about 0.1 wt. % to about 5.0 wt. % of the blend. Embodiment 25 is the composition of embodiment 24, wherein the additive comprises about 1.0 wt. % of the blend. Embodiment 26 is the composition of any one of embodiments 23 to 25, wherein the additive comprises at least one of p-anisaldehyde (AA) or diphenyl ether (DPE). Embodiment 27 is the composition of any one of embodiments 1 to 26, wherein the blend is slot-die coated. Embodiment 28 is the composition of any one of embodiments 1 to 26, wherein the blend is spin coated. Embodiment 29 is the composition of embodiment 27, wherein the blend is slot-die coated from a halogen-free solvent. Embodiment 30 is the composition of embodiment 28, wherein the blend is spin coated from a halogen-free solvent. Embodiment 31 is the composition of any one of embodiments 1 to 30, wherein the blend produces a band gap suitable for low intensity light harvesting, and wherein the blend has significant absorption of visible light between 380 nm and 940 nm suitable for low intensity light harvesting, and wherein the blend has an EQE of at least 10% between about 380 nm and about 900 nm with a film thickness ranging between about 90 nm and about 500 nm. Embodiment 32 is the composition of any one of embodiments 1 to 31, wherein the blend is provided in the form of a bulk material or a film. Embodiment 33 is an optical or electronic device comprising the composition of any one of embodiments 1 to 32. Embodiment 34 is the device of embodiment 33, wherein the device further comprises an anode and a cathode. Embodiment 35 is the device of embodiment 34, wherein the device comprises an active layer between the anode and the cathode. Embodiment 36 is the optical or electronic device of embodiment 33, wherein the device is a photovoltaic cell, an organic transistor, a light emitting diode, a photodetector. Embodiment 37 is an organic semiconductor material, layer or component, comprising the composition as defined in any one of embodiments 1 to 32. Embodiment 38 is the use of the composition as defined in any one of embodiments 1 to 32 as an organic semiconductor material, layer or component. Embodiment 39 is the use of the composition as defined in any one of embodiments 1 to 32 in an electronic device. Embodiment 40 is the use of embodiment 39, wherein the electronic device is a photovoltaic cell, an organic transistor, a light emitting diode, a photodetector. Embodiment 41 is the use of the composition of any one of embodiments 1 to 32 for inkjet printing. Embodiment 42 is the use of the composition of any one of embodiments 1 to 32 for screen printing. Embodiment 43 is the use of the composition of any one of embodiments 1 to 32 for flexographic printing. Embodiment 44 is the use of the composition of any one of embodiments 1 to 32 for offset printing. Embodiment 45 is the use of the composition of any one of embodiments 1 to 32 for rotogravure printing.

Embodiment 46 is a blend comprising at least two electron acceptor materials $A_1$ and $A_2$, and at least an electron donor material $D_1$, wherein one of the electron acceptor materials is a N-annulated perylene diimide-based electron acceptor material. Embodiment 47 is a blend comprising at least two electron acceptor materials $A_1$ and $A_2$, and at least one electron donor material $D_1$, wherein the at least one electron donor material $D_1$ comprises poly[(2,5-bis(2-hexyldecyloxy) phenylene)-alt-(5,6-difluoro-4,7-di(thiophen-2-yl)benzo[c] [1,2,5]thiadiazole)] (PPDT2FBT), and wherein one of the at least two electron acceptor materials $A_1$ and $A_2$ comprises a N-annulated perylene diimide-based electron acceptor material or an alkyl-12,13-dihydro[1,2,5] thiadiazolo [3,4e]thieno[2",3":4',5'] thieno[2',3':4,5] pyrrolo[3,2-g] thieno[2',3':4,5]thieno[3,2-b]indole-2,10-diyl)bis(methanylylidene)) bis(3-oxo-2,3-dihydro1H-indene-2,1-diylidene)) dimalononitrile) (BTP)-based electron acceptor material. Embodiment 48 is the blend of embodiment 46 or 47, wherein the blend is a ternary blend comprising a N-annulated perylene diimide-based electron acceptor material, a second electron acceptor material, and an electron donor material comprising PPDT2FBT. Embodiment 49 is the blend of embodiment 46 or 47, wherein the blend is a ternary blend comprising a BTP-based electron acceptor material, a second electron acceptor material, and an electron donor material comprising PPDT2FBT. Embodiment 50 is the blend of embodiment 48 or 49, wherein the blend comprises a mass ratio (w/w) of donor material to acceptor material ranging from about 1:1.0 to about 1:2.0. Embodiment 51 is the blend of embodiment 50, wherein the mass ratio (w/w) of donor material to acceptor material ranges from about 1:1.1 to about 1:1.9. Embodiment 52 is the blend of embodiment 51, wherein the mass ratio (w/w) of donor material to acceptor material ranges from about 1:1.2 to about 1:1.8. Embodiment 53 is the blend of embodiment 52, wherein the mass ratio (w/w) of donor material to acceptor material ranges from about 1:1.3 to about 1:1.7. Embodiment 54 is the blend of embodiment 53, wherein the mass ratio (w/w) of donor material to acceptor material ranges from about 1:1.4 to about 1:1.6. Embodiment 55 is the blend of embodiment 54, wherein the mass ratio (w/w) of donor material to acceptor material is about 1:1.5. Embodiment 56 is the blend of any one of embodiments 50 to 55, wherein the blend comprises FBT:$PC_{61}$BM:PDI. Embodiment 57 is the blend of embodiment 56, wherein the mass ratio (w/w) of FBT:$PC_{61}$BM:PDI is about 1:1.35:0.15. Embodiment 58 is the blend of embodiment 56, wherein the mass ratio (w/w) of FBT:$PC_{61}$BM:PDI is about 1:1.2:0.3. Embodiment 59 is the blend of embodiment 56, wherein the mass ratio (w/w) of FBT:$PC_{61}$BM:PDI is about 1:1.05:0.45. Embodiment 60 is the blend of embodiment 56, wherein the mass ratio (w/w) of FBT:$PC_{61}$BM:PDI is about 1:0.9:0.6. Embodiment 61 is the blend of embodiment 56, wherein the mass ratio (w/w) of FBT:$PC_{61}$BM:PDI is about 1:0.75:0.75. Embodiment 62 is the blend of any one of embodiments 50 to 55, wherein the blend comprises FBT:$PC_{61}$BM:BTP. Embodiment 63 is the blend of embodiment 62, wherein the mass ratio (w/w) of FBT:$PC_{61}$BM:BTP is about 1:1.35:0.15. Embodiment 64 is the blend of embodiment 62, wherein the mass ratio (w/w) of FBT:$PC_{61}$BM:BTP is about 1:1.2:0.3. Embodiment 65 is the blend of embodiment 62, wherein the mass ratio (w/w) of FBT:$PC_{61}$BM:BTP is about 1:1.05:0.45. Embodiment 66 is the blend of embodiment 62, wherein the mass ratio (w/w) of FBT:$PC_{61}$BM:BTP is about 1:0.9:0.6. Embodiment 67 is the blend of embodiment 62, wherein the mass ratio (w/w) of FBT:$PC_{61}$BM:BTP is about 1:0.75:0.75. Embodiment 68 is the blend of any one of embodiments 46 to 67, wherein the blend further comprising an additive. Embodiment 69 is the blend of embodiment 68, wherein the additive comprises from about 0.1 wt. % to about 5.0 wt. % of the blend. Embodiment 70 is the blend of embodiment 69, wherein the additive comprises about 1.0 wt. % of the blend. Embodiment 71 is the blend of any one of embodiments 68 to 70, wherein the additive comprises at least one of p-anisaldehyde (AA) or diphenyl ether (DPE). Embodiment 72 is the blend of any one of embodiments 46 to 71, wherein the blend is slot-die coated. Embodiment 73 is the blend of any one of embodiments 46 to 71, wherein the blend is spin coated. Embodiment 74 is the blend of embodiment 72, wherein the blend is slot-die coated from a halogen-free solvent. Embodiment 75 is the blend of embodiment 73, wherein the blend is spin coated from a halogen-free solvent. Embodiment 76 is the blend of any one of embodiments 46 to 75, wherein the blend produces a band gap suitable for low intensity light harvesting, and wherein the blend has significant absorption of visible light between 380 nm and 940 nm suitable for low intensity light harvesting, and wherein the blend has an EQE of at least 10% between about 380 nm and about 900 nm with a film thickness ranging between about 90 nm and about 500 nm. Embodiment 77 is the blend of any one of embodiments 46 to 76, wherein the blend is provided in the form of a bulk material or a film. Embodiment 78 is an optical or electronic device comprising the blend of any one of embodiments 46 to 77. Embodiment 79 is the device of embodiment 78, wherein the device further comprises an anode and a cathode. Embodiment 80 is the device of embodiment 79, wherein the device comprises an active layer between the anode and the cathode. Embodiment 81 is the optical or electronic device of embodiment 78, wherein the device is a photovoltaic cell, an organic transistor, a light emitting diode, a photodetector. Embodiment 82 is an organic semiconductor material, layer or component, comprising the blend as defined in any one of embodiments 46 to 77. Embodiment 83 is the use of the blend as defined in any one of embodiments 46 to 77 as an organic semiconductor material, layer or component. Embodiment 84 is the use of the blend as defined in any one of embodiments 46 to 77 in an electronic device. Embodiment 85 is the use of embodiment 84, wherein the electronic device is a photovoltaic cell, an organic transistor, a light emitting diode, a photodetector. Embodiment 86 is the use of the blend as defined in any one of embodiments 46 to 77 for inkjet printing. Embodiment 87 is the use of the blend as defined in any one of embodiments 46 to 77 for screen printing. Embodiment 88 is the use of the blend as defined in any one of embodiments 46 to 77 for flexographic printing. Embodiment 89 is the use of the blend as defined in any one of embodiments 46 to 77 for offset printing. Embodiment 90 is the use of the blend as defined in any one of embodiments 46 to 77 for rotogravure printing.

The foregoing and other advantages and features of the present disclosure will become more apparent upon reading of the following non-restrictive description of illustrative embodiments thereof, given by way of example only with reference to the accompanying drawings/figures.

BRIEF DESCRIPTION OF THE DRAWINGS/FIGURES

In the appended drawings/figures:

FIG. 1 illustrates (a) the chemical structures of $PC_{61}$BM, PDI and FBT; (b) the electronic energy levels for $PC_{61}$BM, PDI and FBT; (c) optical absorption spectra of neat $PC_{61}$BM, PDI and FBT films, spin coated from o-xylene (10 mg/mL); and (d) emission spectra of a 2700 K (warm) and 6500 K (cold) at 2000 lux LED illumination. The UV-Vis optical absorption profile of the spin coated ternary blend (FBT:$PC_{61}$BM:PDI (1:1.2:0.3)) from a 20 mg/mL o-xylene solution containing 1% (v/v) AA is superimposed to illustrate the match between the emission spectrum of the LED and the absorption spectra of the ternary blend.

FIG. 2 illustrates the current density-voltage (J-V) curves of the binary systems (FBT:$PC_{61}$BM) and (FBT:PDI) with different additives p-anisaldehyde (AA) and diphenyl ether (DPE) used for solution processing (1% v/v in o-xylene).

FIG. 3*a* illustrates the current density-voltage (J-V) curves of spin coated active layers containing different PDI % in the ternary system under 1 sun illumination; (b) and (c) illustrate the corresponding EQE (External Quantum Efficiency) and UV-Vis optical absorption spectra respectively. The control device corresponds to the binary FBT:$PC_{61}$BM system.

Figure 6:
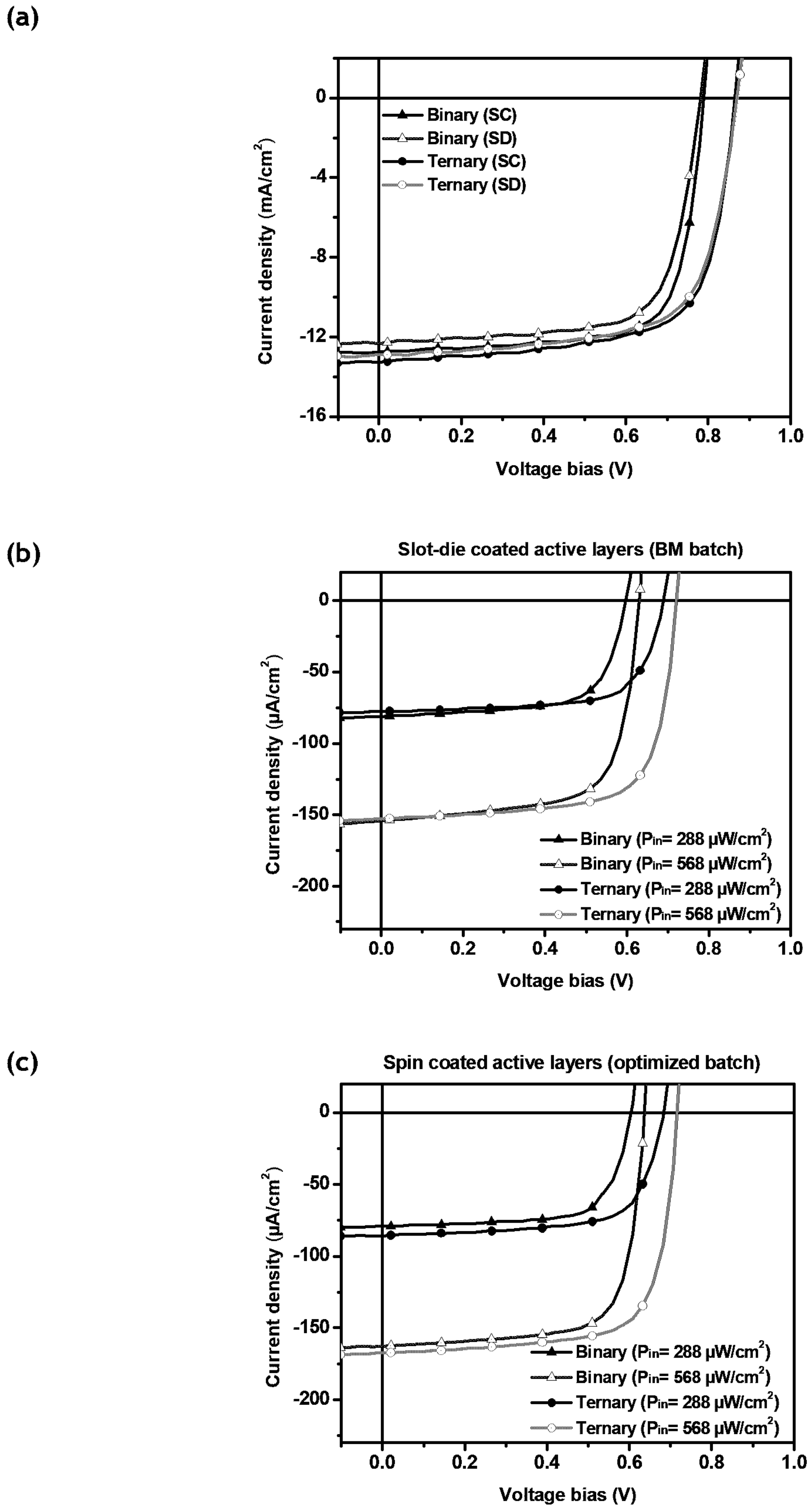

FIG. 6*a* illustrates the current density-voltage (J-V) curves of spin coated (SC) versus slot-die coated (SD) binary and ternary active layers under 1 sun illumination; (b) current density-voltage (J-V) curves of the slot-die coated binary and ternary (20 wt. % PDI) active layers under different indoor light illuminations; and (c) current density-voltage (J-V) curves of the spin coated binary and ternary (20 wt. % PDI) active layers under different warm indoor light illuminations. ZnO/PEIE was used as the electron transport layer.

Figure 7:
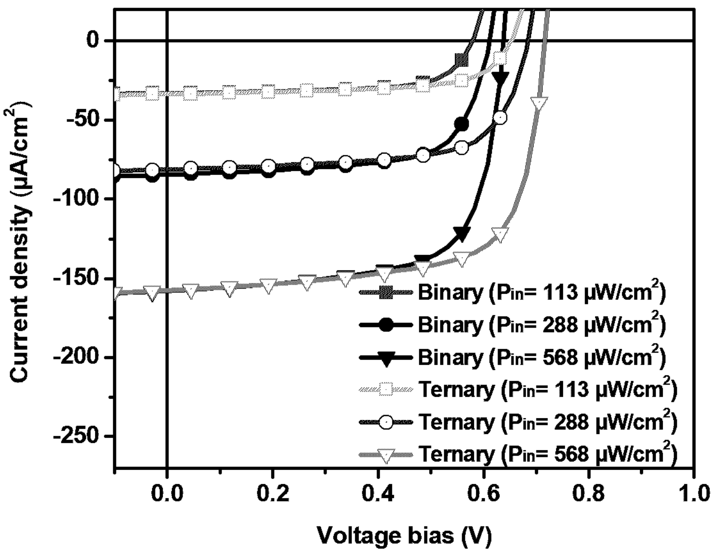

FIG. 7 illustrates the current density-voltage (J-V) curves of spin coated (SC) binary and ternary devices under different warm indoor light illumination.

Figure 8:
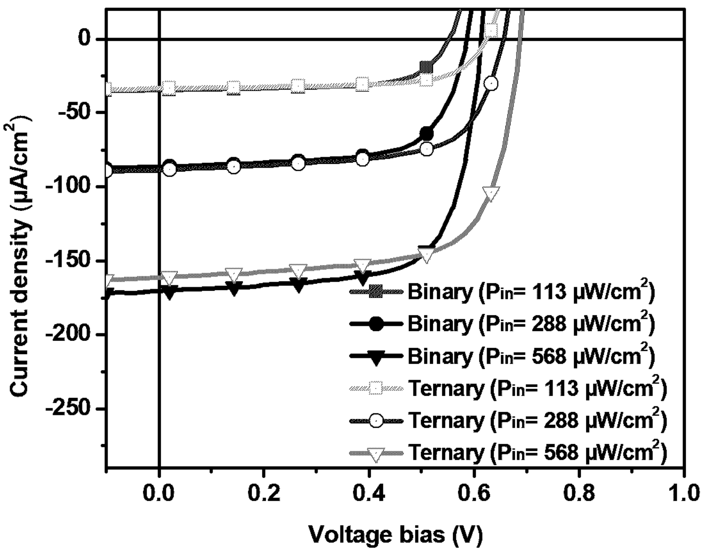

FIG. 8 illustrates the current density-voltage (J-V) curves of spin coated (SC) binary and ternary devices under different warm indoor light illumination.

Figure 9:
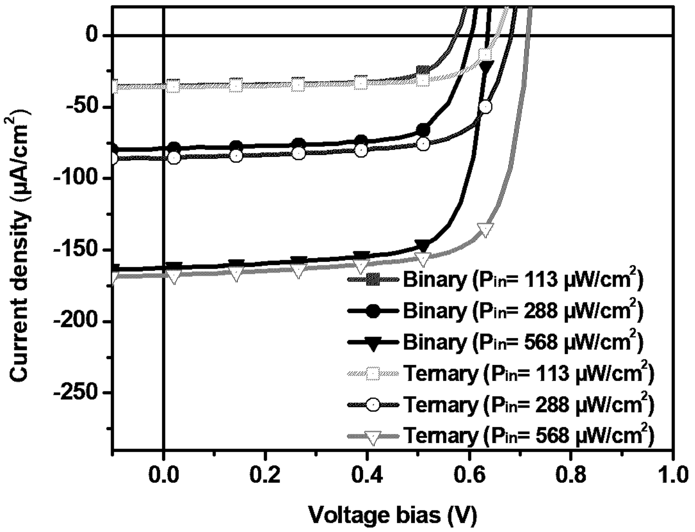

FIG. 9 illustrates the current density-voltage (J-V) curves of spin coated (SC) binary and ternary devices under different warm indoor light illumination.

Figure 10:
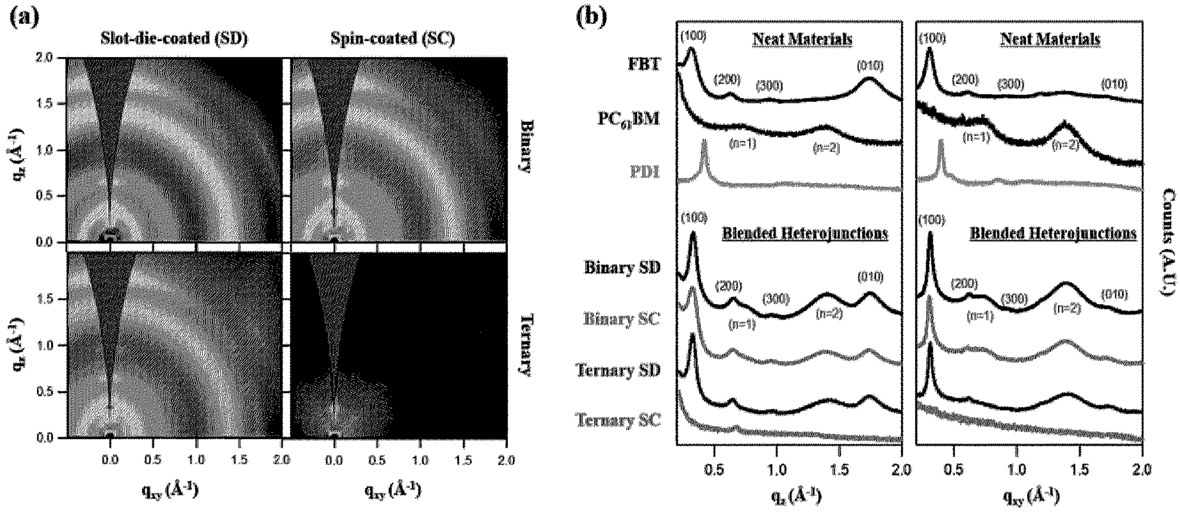

FIG. 10 illustrates grazing incidence wide-angle x-ray scattering (GIWAXS) images of: (a) 2-dimensional intensity vs. q-space images for the blends; and (b) complementary one-dimensional intensity vs. $q_z$-space (left) and $q_{xy}$-space (right) plots.

Figure 11:
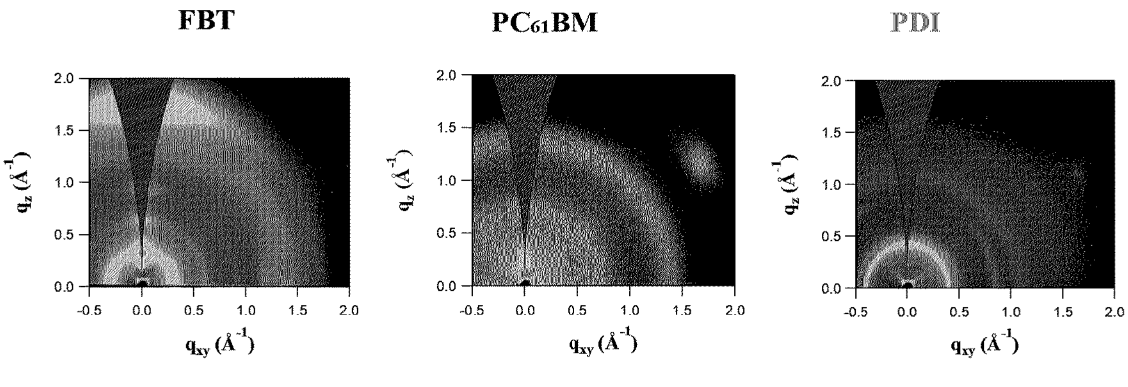

FIG. 11 illustrates GIWAXS 2-D detector images for FBT, $PC_{61}BM$, and PDI.

Figure 12:
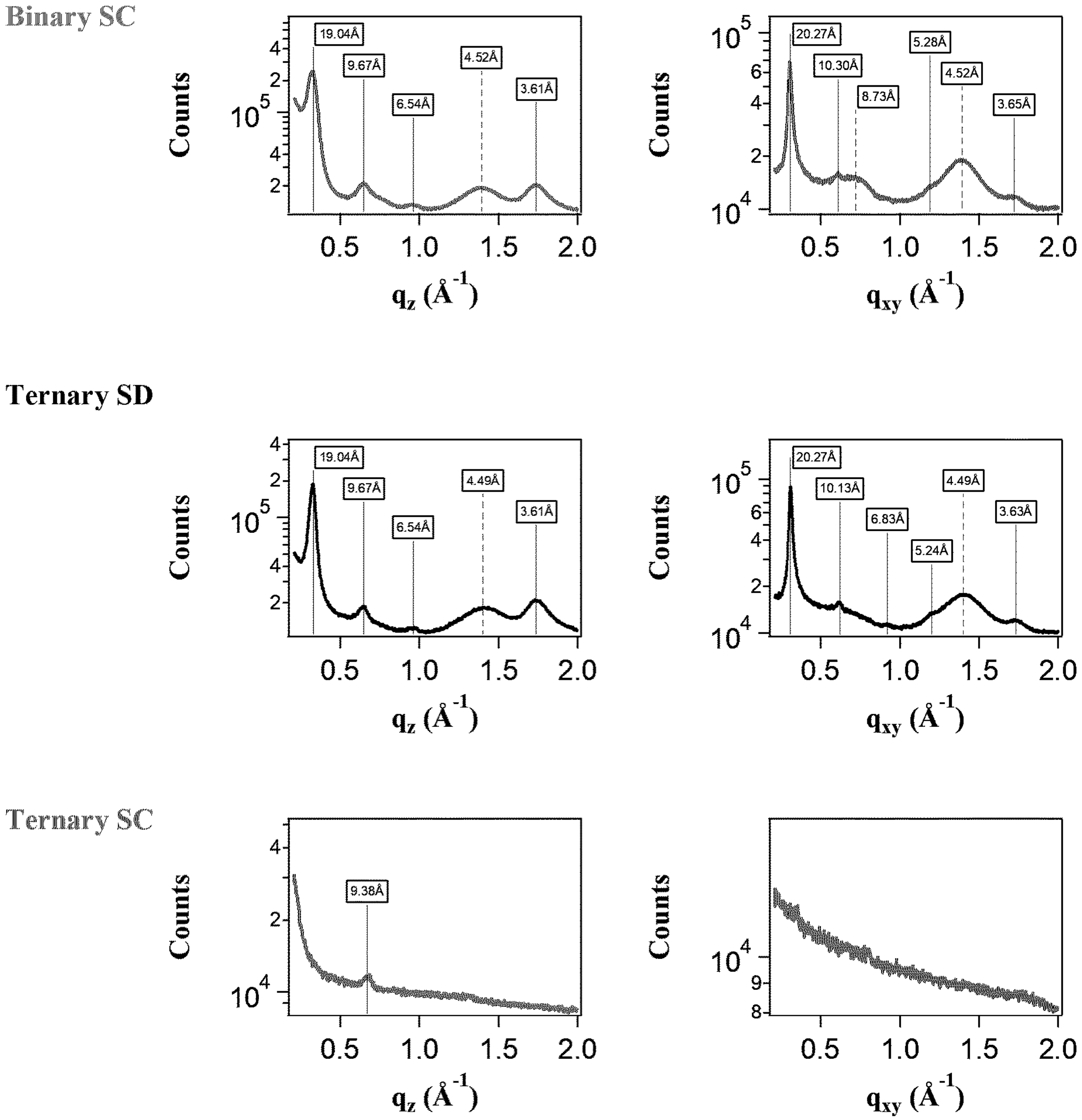

FIG. 12 illustrates GIWAXS 1-D plots with cake slices in the $q_z$ (out-of-plane) and $q_{xy}$ (in-plane) directions for binary (SC), ternary (SD) and ternary (SC) blends.

Figure 13:
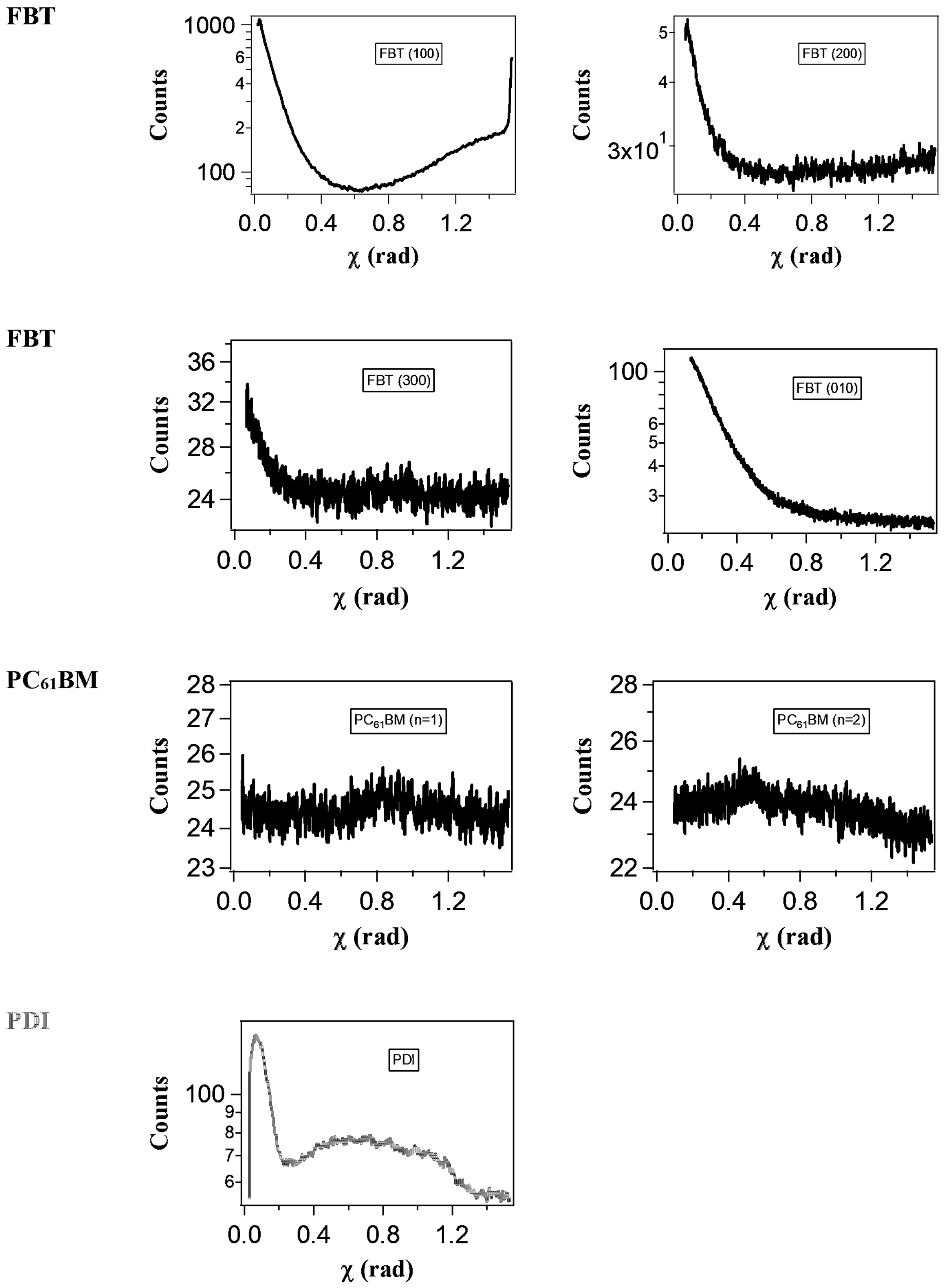

FIG. 13 illustrates GIWAXS chi plots as intensity vs. angle for the prominent 1-D peaks for FBT, $PC_{61}BM$, and PDI.

Figure 14:
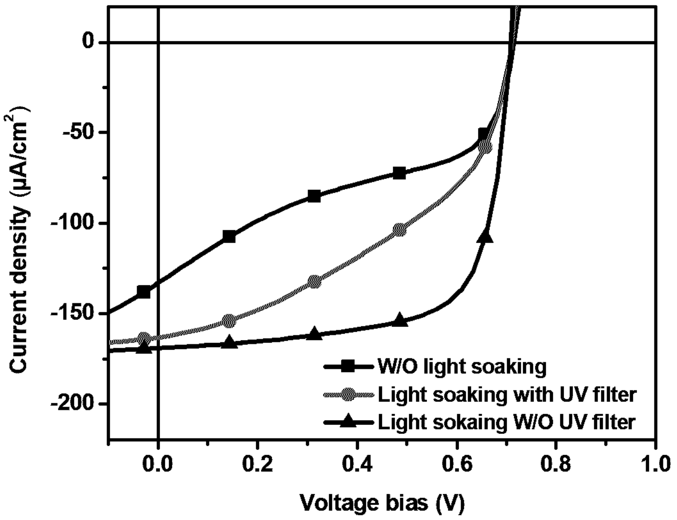

FIG. 14 illustrates the light soaking (LS) effect under various conditions on the current density-voltage (J-V) curves of spin coated ternary devices under warm low light intensity (2000 lux).

Figure 15:
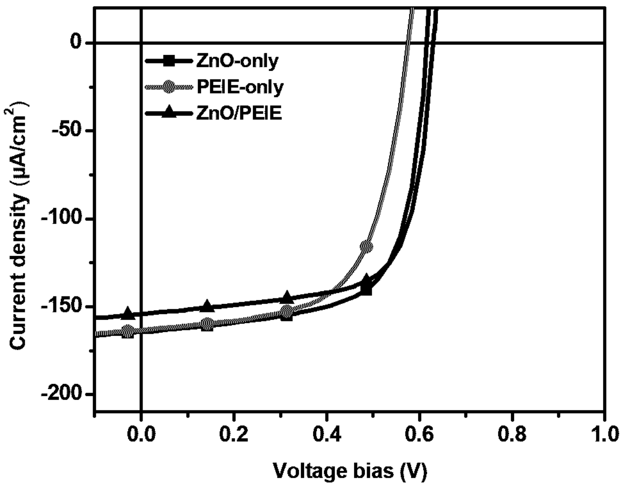

FIG. 15 illustrates the light soaking (LS) effect on the current density-voltage (J-V) curves of slot-die (SD) coated binary (FBT:$PC_{61}BM$) and ternary (FBT:$PC_{61}BM$:PDI) devices using different electron transporting layers under indoor warm light illumination (2000 lux).

Figure 16:
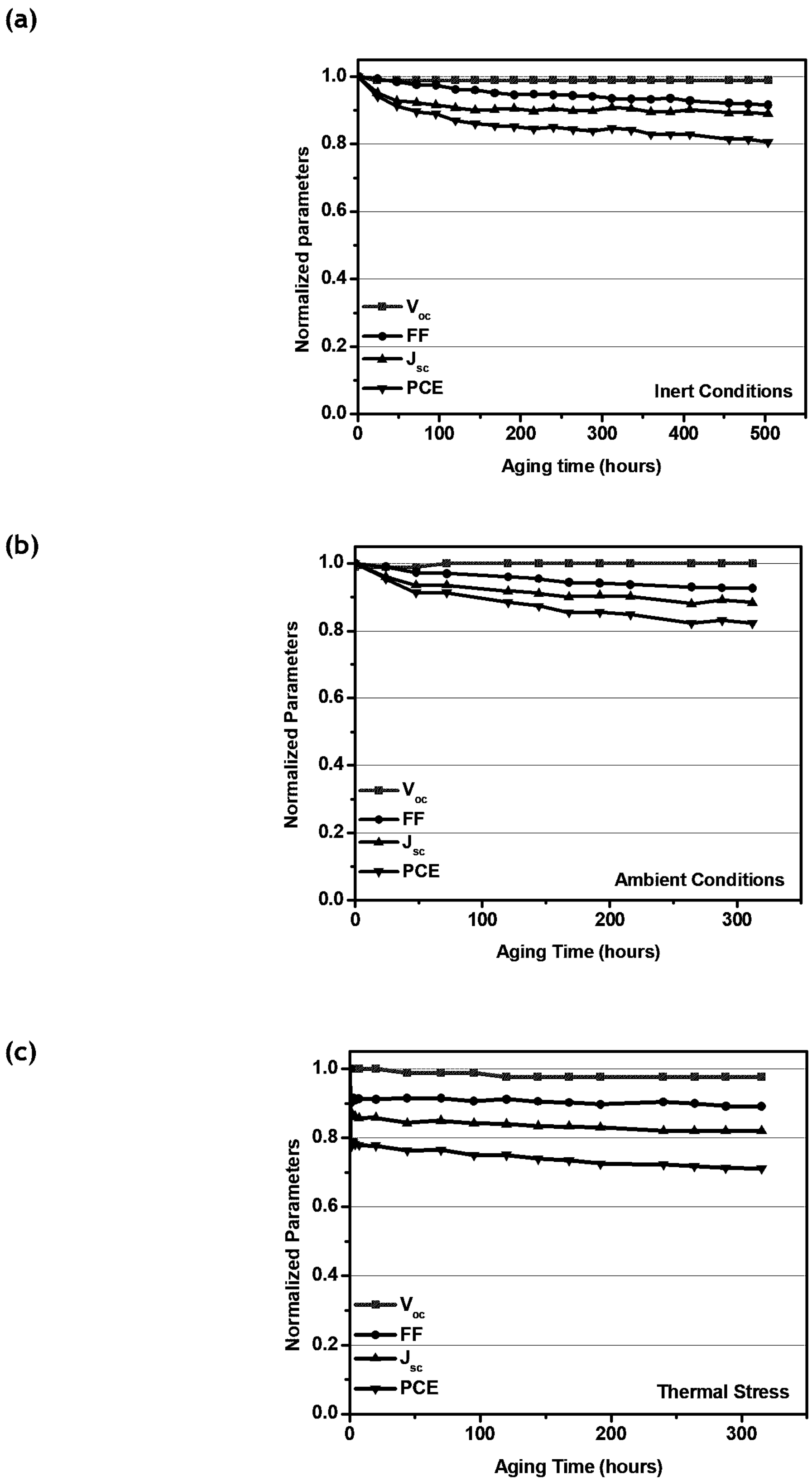

FIG. 16 illustrates normalized photovoltaic metrices for unencapsulated inverted devices based on slot-die coated optimized ternary active layers (FBT:$PC_{61}BM$:PDI; 1:1.2:0.3) subjected to stability tests under (a) inert conditions in a nitrogen-filled glovebox; (b) ambient conditions at room temperature and 30% relative humidity; and (c) thermal stress in a nitrogen-filled glovebox under continuous heating at 80° C. All devices are unencapsulated and tested in air under 1 sun illumination. ZnO/PEIE was used as the electron transport layer.

Figure 17:
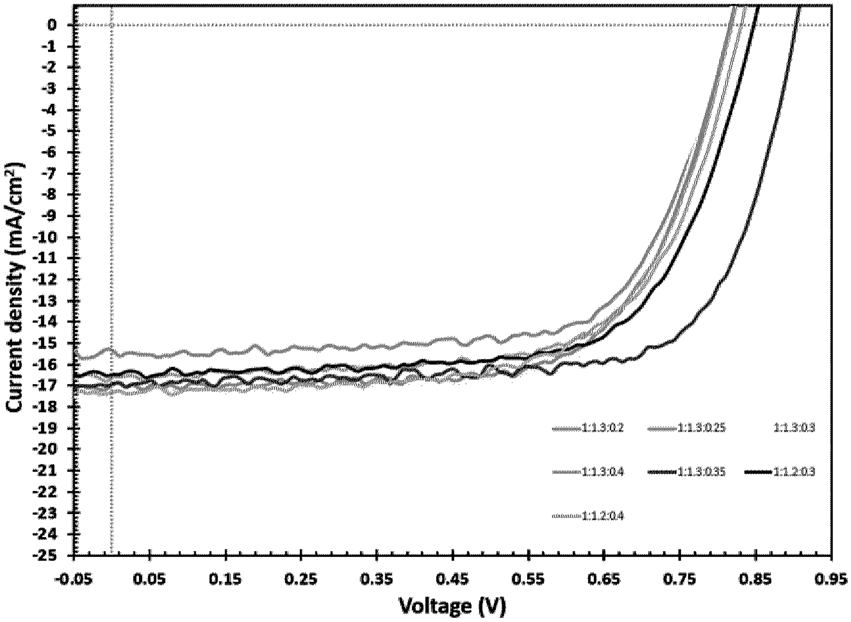

FIG. 17 illustrates the current density-voltage (J-V) curves of spin coated (SC) ternary (FBT:$PC_{61}BM$:BTP) devices under 1.5G light illumination.

Figure 18:
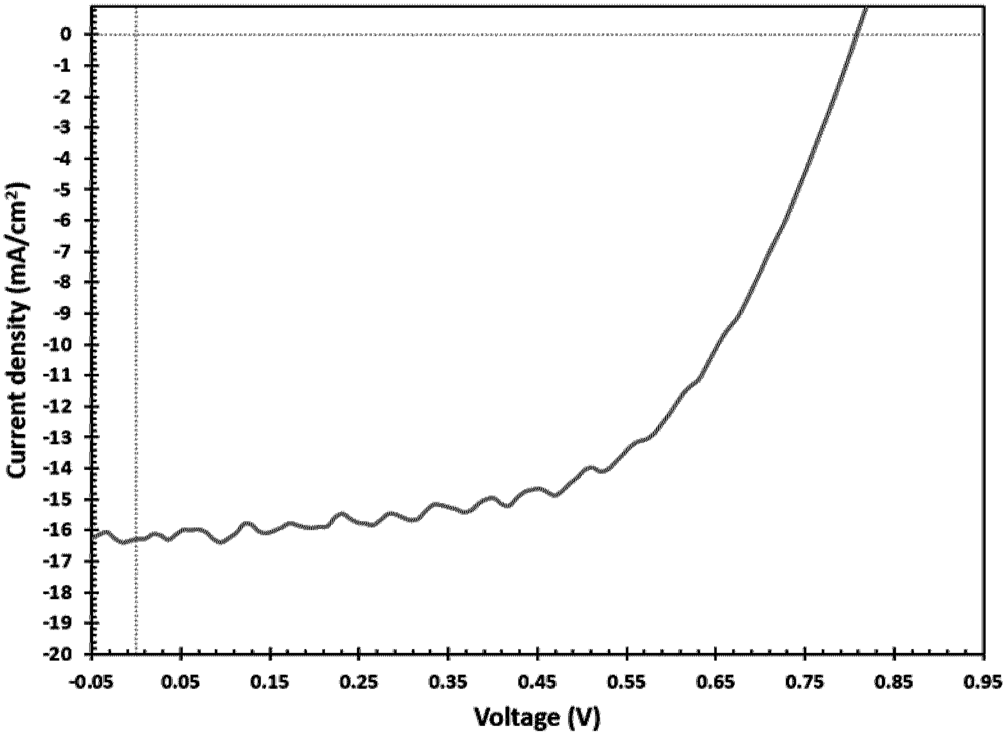

FIG. 18 illustrates the current density-voltage (J-V) curves of spin coated (SC) quaternary (FBT:$PC_{61}BM$:BTP:PDI) devices under 1.5G light illumination.

DETAILED DESCRIPTION

Glossary

In order to provide a clear and consistent understanding of the terms used in the present disclosure, a number of definitions are provided below. Moreover, unless defined otherwise, all technical and scientific terms as used herein have the same meaning as commonly understood by one of ordinary skill in the art to which this specification pertains.

The word "a" or "an" when used in conjunction with the term "comprising" in the claims and/or the specification may mean "one", but it is also consistent with the meaning of "one or more", "at least one", and "one or more than one" unless the content clearly dictates otherwise. Similarly, the word "another" may mean at least a second or more unless the content clearly dictates otherwise.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

As used in this specification and claim(s), the word "consisting" and its derivatives, are intended to be close ended terms that specify the presence of stated features, elements, components, groups, integers, and/or steps, and also exclude the presence of other unstated features, elements, components, groups, integers and/or steps.

The term "consisting essentially of", as used herein, is intended to specify the presence of the stated features, elements, components, groups, integers, and/or steps as well as those that do not materially affect the basic and novel characteristic(s) of these features, elements, components, groups, integers, and/or steps.

The terms "about", "substantially" and "approximately" as used herein mean a reasonable amount of deviation of the modified term such that the end result is not significantly changed. These terms of degree should be construed as including a deviation of at least ±1% of the modified term if this deviation would not negate the meaning of the word it modifies.

The term "polymer" as used herein generally includes, but is not limited to, homopolymers and copolymers, such as for example block, random and alternating copolymers.

The term "BTP" as used herein is intended to refer to a class of conjugated organic semi-conductor material (an electron acceptor material) comprising a fused thienothienopyrrolo-thienothienoindole core and 2-(5,6-dichloro-3-oxo-2,3-dihydro-1H-inden-1-ylidene)malononitrile end units. BTP can be illustrated by the following structure:

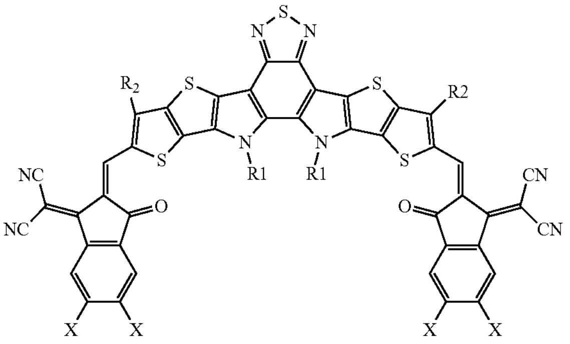

wherein each X is independently selected from Cl, Br, F and H; and each R1 and R2 are independently a C1-C30 linear or branched alkyl group. The C1-C30 linear or branched alkyl group may be interrupted by heteroatoms or groups of atoms selected from the group consisting of O, S, NH, NR, SiR'R', CO, $CO_2$— (R and R' being a C1-C10 linear or branched alkyl group); may comprise one or more double and/or triple bonds; and may comprise one or more aryl and/or heteroaryl substituents. In an embodiment of the present disclosure, the R1 group is at least one of ethylhexyl, dodecyl and butyloctyl; the R2 group is at least one of nonyl and undecanyl; and X is at least one of Cl, Br, F and H. In a further embodiment of the present disclosure, the R1 group is at least one of ethylhexyl, dodecyl and butyloctyl; the R2 group is at least one of nonyl and undecanyl; and X is H.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound.

As used herein, fill factor (FF) is the ratio (given as a percentage) of the actual maximum obtainable power, (Pm or Vmp*Jmp), to the theoretical (not actually obtainable) power, ($J_{se}$*$V_{oc}$). Accordingly, the FF can be determined using the equation FF=(Vmp*Jmp)/($J_{se}$*$V_{oc}$) where Jmp and Vmp represent the current density and voltage at the maximum power point (Pm), respectively, this point being obtained by varying the resistance in the circuit until J*V is at its greatest value; and $J_{se}$ and $V_{oc}$ represent the short circuit current and the open circuit voltage, respectively. The FF is a key parameter in evaluating the performance of solar cells.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/$m^2$) under standard test conditions (STC) and the surface area of the solar cell (Ac in $m^2$). STC typically refers to a temperature of 25° C. and an irradiance of 1000 W/$m^2$ with an air mass 1.5 (AM 1.5) spectrum.

In an aspect, the present disclosure relates to the use of ternary blends for enhancing device photocurrent generation. In an embodiment of the present disclosure, the ternary blend comprises a FBT: fullerene system. In a further embodiment of the present disclosure, the ternary blend comprises FBT as the electron donor polymer, $PC_{61}BM$ as a first electron acceptor material, and PDI as a second electron acceptor material. In a further embodiment of the present disclosure, the ternary blend comprises FBT as the electron donor polymer, $PC_{61}BM$ as a first electron acceptor material, and BTP as a second electron acceptor material.

Figure 1:
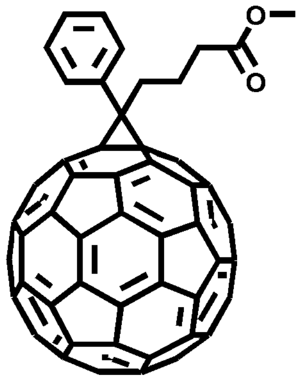
Figure 1:
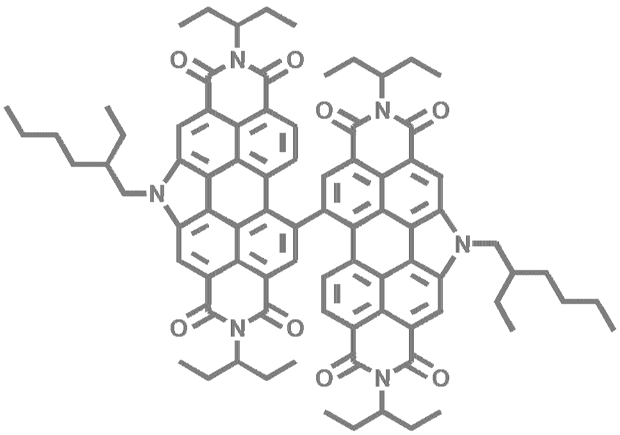
Figure 1:
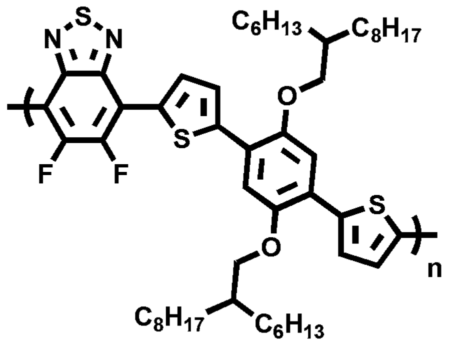
Figure 1:
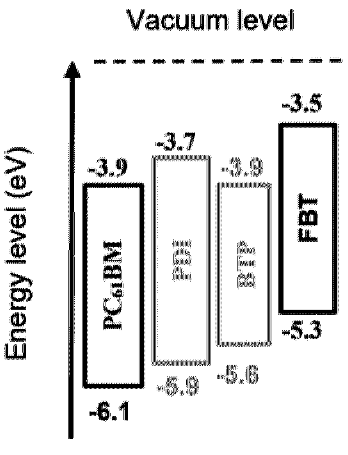
Figure 1:
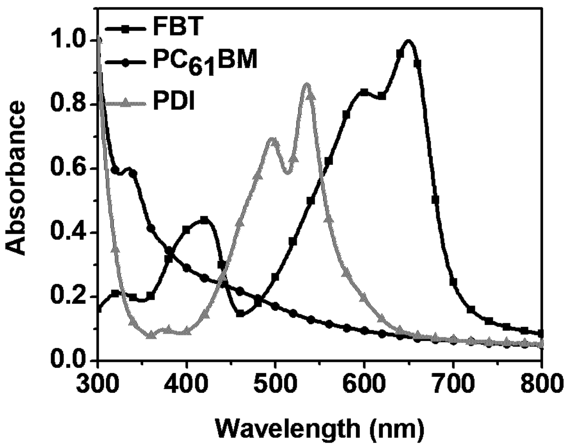
Figure 1:
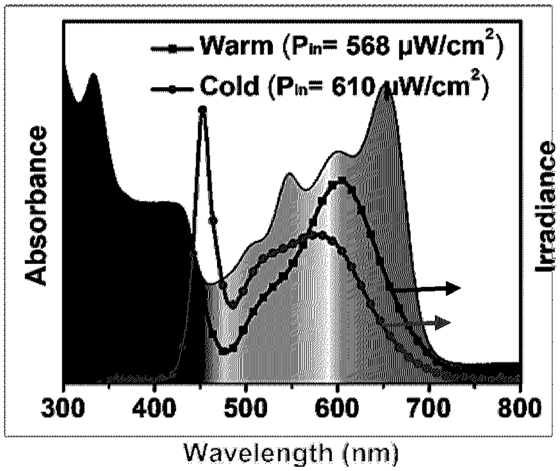

The respective energy levels of $PC_{61}BM$, PDI, BTP and FBT, as determined from the $E_{1/2}$ of the solution-based cyclic voltammetry, and the relative energetic alignment between $PC_{61}BM$, PDI, BTP and FBT are illustrated in FIG. 1B. The neat material energetics predict suitable energy cascades for ternary blends, with approximately 200 mV offsets in the lowest-unoccupied molecular orbitals (LUMOs) to drive electron transfer. The optical absorption spectra of neat films of these three compounds are illustrated in FIG. 1*c*. In an embodiment of the present disclosure, the materials were chosen in part to cover a broad region of the indoor LED emission spectrum. To that effect, PDI exhibits strong optical absorption from about 400-650 nm which complements that of FBT (450-750 nm). The optical absorption spectra of both FBT and PDI were shown to overlap with the emission spectrum of artificial white LEDs (400-650 nm). It was thus surmised that the ternary blend could effectively absorb the photons in this range (FIG. 1*d*). Control OPV devices based on the binary blends FBT:PDI and FBT:$PC_{61}BM$ were fabricated. The associated photovoltaic metrics for these binary blends are illustrated in Table 1.

TABLE 1

Photovoltaic metrics of devices with spin coated binary active layers and additive effect.

| | $V_{oc}$ (V) | $J_{sc}$ (mA/$cm^2$) | FF (%) | PCE (%) |
|---|---|---|---|---|
| FBT:$PC_{61}BM$ (1:1.5) with DPE | 0.73 | 10.9 | 60 | 4.8 |
| FBT:$PC_{61}BM$ (1:1.5) with AA | 0.76 | 12.5 | 73 | 7.0 |
| FBT:PDI (1:1.5), with DPE | 1.01 | 9.2 | 47 | 4.3 |
| FBT:PDI (1:1.5), with AA | 1.01 | 7.5 | 41 | 3.1 |

Device architecture: glass/ITO/ZnO/active layer/$MoO_x$/Ag; Devices spin coated from o-xylene containing 1% AA or 1% DPE as additive, 20 mg/ml total concentration and (1:1.5) weight ratio.

Figure 2:
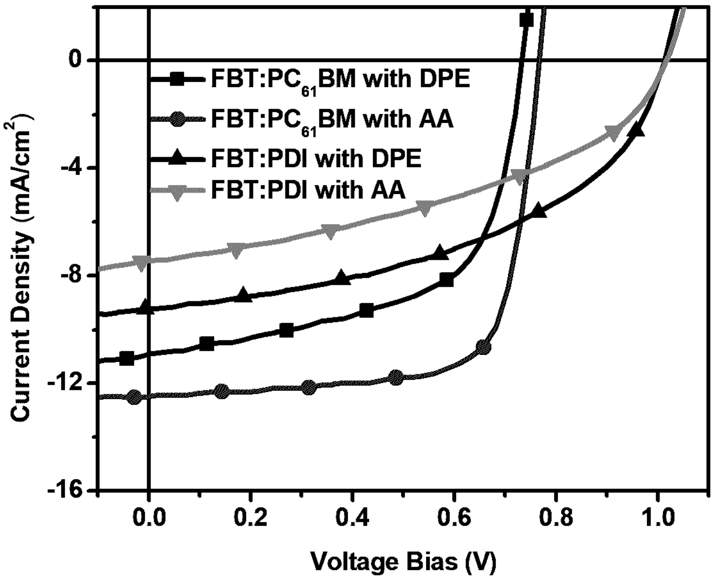
Figure 3:
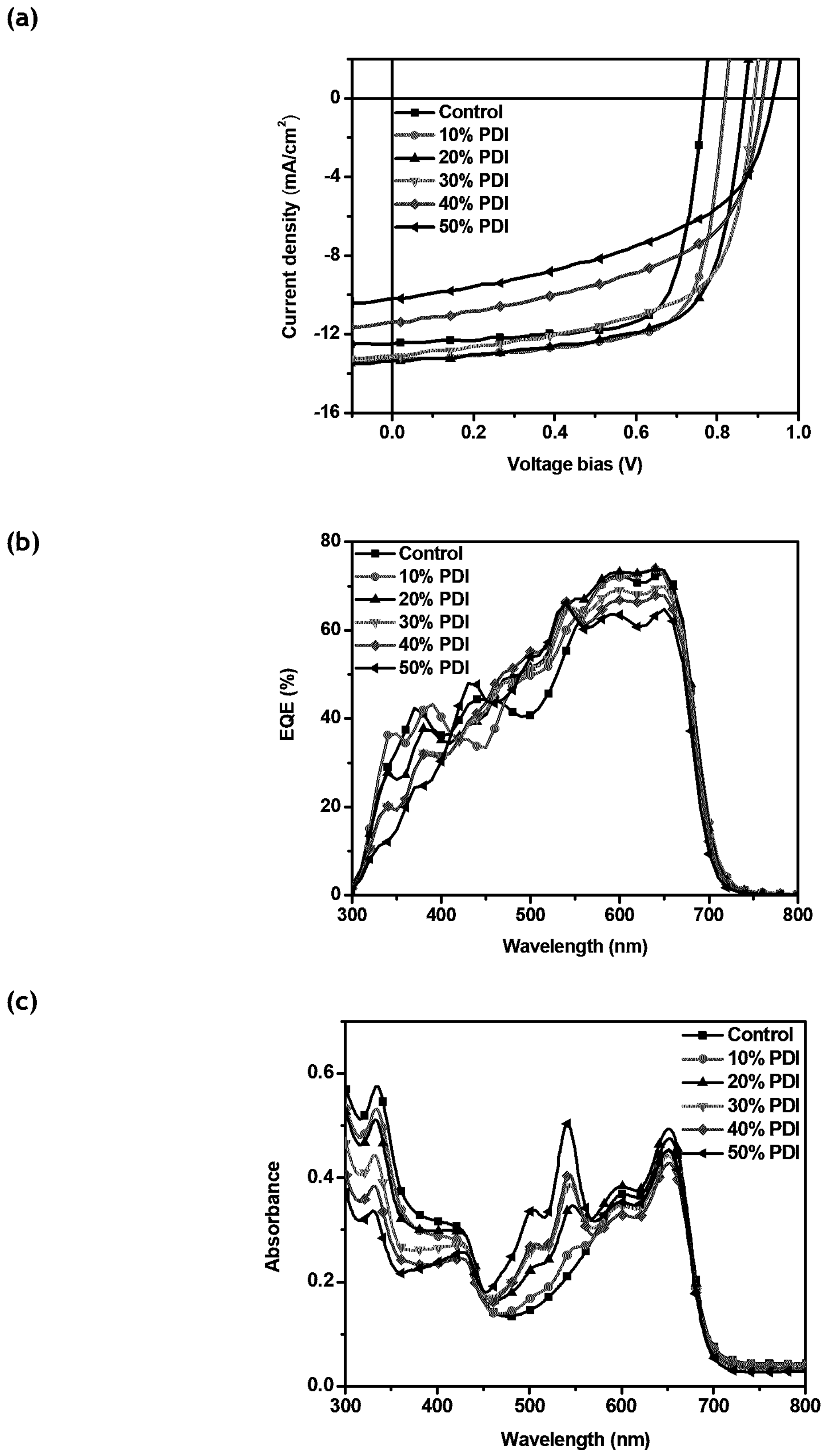

In order to enhance and optimize performance, various ternary blends were prepared. FIG. 3*a* illustrates the current density-voltage (J-V) curves of spin coated devices comprising active ternary blend (FBT:$PC_{61}BM$:PDI) layers comprising different PDI %, compared to a control device comprising a binary blend (FBT:$PC_{61}BM$). Inverted architecture (glass/ITO/ZnO/active layer/$MoO_x$/Ag) was used for the device fabrication, with all active layers air-processed from the halogen-free solvent mixture (o-xylene+1% (v/v) AA). After careful optimization of the additives, based on devices performance of the binary systems (FIG. 2 and Table 1), the diphenyl ether (DPE) additive was substituted for p-anisaldehyde (AA). To that effect, AA is not only considered green but has also been shown to improve the morphology of $PC_{61}BM$ based active layers.[15] The control devices based on the binary blend (FBT:$PC_{61}BM$) achieved a maximum PCE of 7% with the following photovoltaic parameters ($J_{sc}$=12.5 mA/$cm^2$, $V_{oc}$=0.76 V, FF=73%) (Table 2). PDI was subsequently added in different percentages (10-50%) to the FBT:$PC_{61}BM$ blend maintaining a total donor:acceptor ratio of 1:1.5 (w/w) and a 20 mg/mL total concentration for all blend solutions. Increasing the percentage of PDI in the ternary blend up to 30% (1:1.05:0.45), simultaneously enhanced both $J_{sc}$ and $V_{oc}$ values (Table 2 and FIG. 3*a*). The optimum PDI % was determined to be 20% (1:1.2:0.3) which delivered a maximum PCE of 7.9% with the following photovoltaic parameters: $J_{sc}$=13.4 mA/$cm^2$; $V_{oc}$=0.86 V; and FF=68%, showing a 100 mV increase in $V_{oc}$ compared to the binary system.

TABLE 2

Photovoltaic metrics of devices with spin coated active layers containing different PDI % in the ternary blend system under 1 sun illumination.

| FBT:$PC_{61}BM$:PDI [1, 2] | $V_{oc}$ (V) [3] | $J_{sc}$ (mA/$cm^2$) [3] | FF (%) [3] | PCE (%) [3] |
|---|---|---|---|---|
| Control (1:1.5:0) | 0.76 (0.76) | 12.5 (12.4) | 73 (73) | 7.0 (7.0) |
| 10% PDI (1:1.35:0.15) | 0.82 (0.82) | 13.3 (13.2) | 71 (70) | 7.7 (7.6) |
| 20% PDI (1:1.20:0.30) | 0.86 (0.86) | 13.4 (13.2) | 68 (68) | 7.9 (7.8) |

TABLE 2-continued

Photovoltaic metrics of devices with spin coated active layers containing different PDI % in the ternary blend system under 1 sun illumination.

| $FBT:PC_{61}BM:PDI$ [1, 2] | $V_{oc}$ (V) [3] | $J_{sc}$ ($mA/cm^2$) [3] | FF (%) [3] | PCE (%) [3] |
|---|---|---|---|---|
| 30% PDI (1:1.05:0.45) | 0.88 (0.88) | 13.1 (12.5) | 63 (63) | 7.3 (7.0) |
| 40% PDI (1:0.90:0.60) | 0.90 (0.90) | 11.4 (11.0) | 54 (54) | 5.6 (5.4) |
| 50% PDI (1:0.75:0.75) | 0.93 (0.93) | 10.2 (9.8) | 49 (48) | 4.7 (4.4) |

[1] Device architecture: glass/ITO/ZnO/active layer/$MoO_x$/Ag;

[2] Devices processed from o-xylene containing 1% AA additive, 20 mg/mL total concentration and (1:1.5) $D:A_1:A_2$ ratio (D: FBT, $A_1$: $PC_{61}BM$, and $A_2$: PDI).

[3] The values of the best device are reported, while the values in parentheses stand for the average PCEs from over 15 devices with 0.14 $cm^2$ active area.

Figure 4:
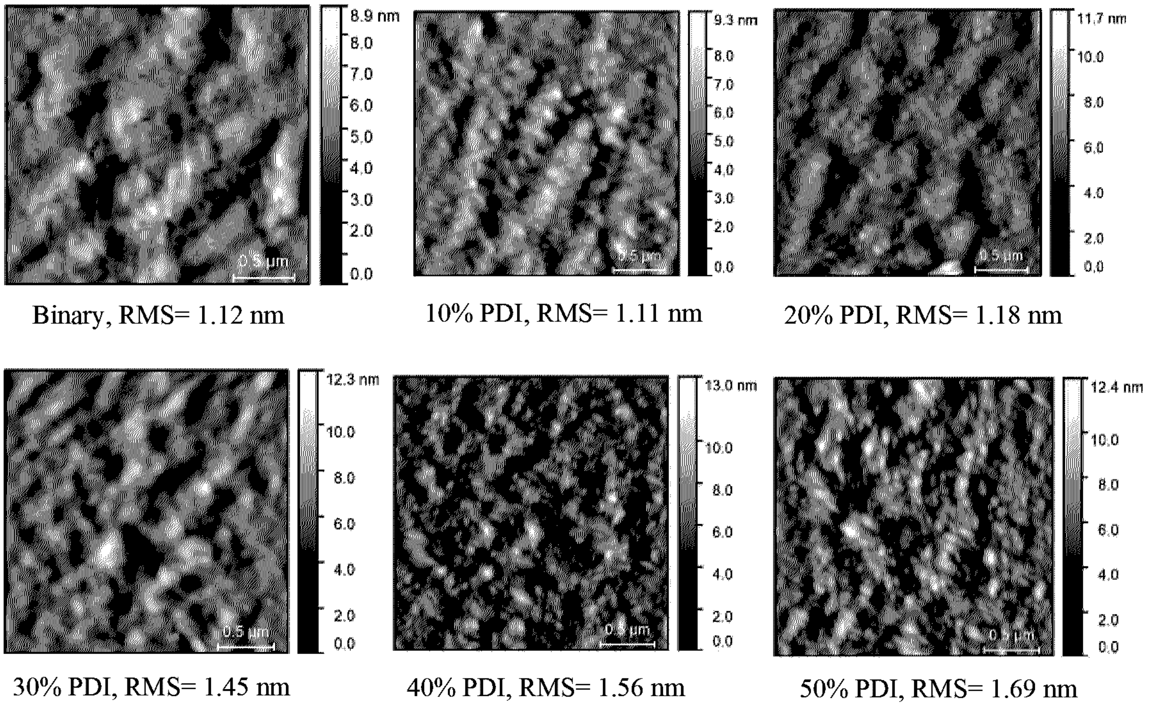
FIG. 4 illustrates various AFM height images of binary vs ternary films further comprising different PDI % (spin coated).
Figure 5:
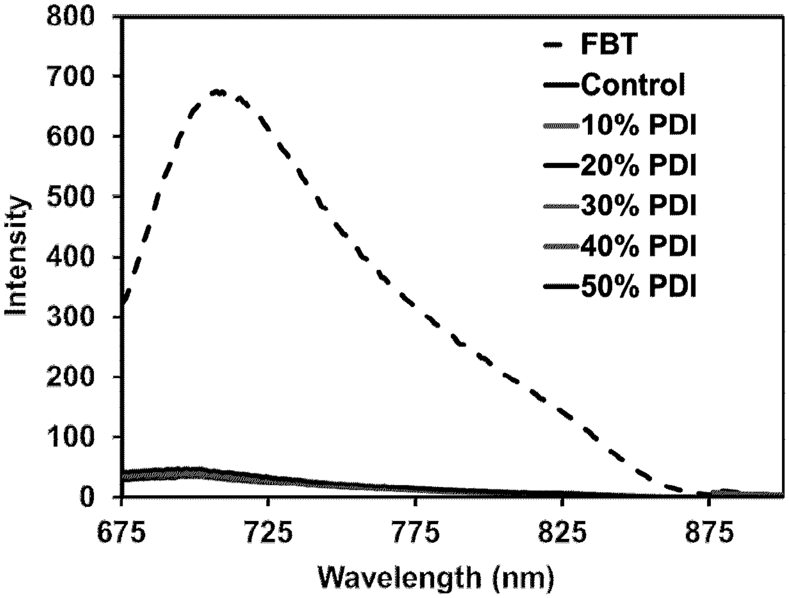
FIG. 5 illustrates various PL spectra of binary vs ternary films further comprising different PDI % (spin coated).

External quantum efficiency (EQE) (FIG. 3*b*), combined with optical absorption spectra (FIG. 3*c*), confirm the contribution of PDI to the photocurrent generation within the ternary devices over the 400-650 nm absorption range, which is consistent with the observed enhanced $J_{sc}$. Further increasing the PDI to 40% (1:0.9:0.6) adversely affected the $J_{sc}$ (11.4 $mA/cm^2$) and FF (54%), while still increasing the $V_{oc}$ (0.90 V), yielding an overall lower PCE of 5.6%. This deterioration in device performance is expected with increasing PDI % in the ternary blend owing to the lower electron mobility of PDI compared to $PC_{61}BM$, and in view of no major changes to the surface morphology or photoluminescence (PL) quenching having been observed (FIGS. 4 and 5). The addition of PDI can thus boost the $V_{oc}$ while also maintaining a higher PCE.

In an aspect, the present disclosure relates to inverted type ternary OPV devices comprising $FBT:PC_{61}BM:PDI$ active layers processed from a halogen-free solvent mixture (o-xylene and 1% (v/v) p-anisaldehyde (AA))[16] in air via two different coating techniques (spin coating and slot-die coating). In an embodiment, the ternary blends were fabricated with a donor:acceptor ratio of 1:1.5 w/w, and 20 mg/mL total concentration. It was discovered that increasing the percentage of PDI in the ternary blend up to 20% (1:1.2:0.3) simultaneously enhanced both device short circuit current ($J_{sc}$) and open circuit voltage ($V_{oc}$), although a small decrease in fill factor was observed. In a particular embodiment, the PDI content in the ternary blend is about 20%. In further embodiments, the PDI content may comprise from about 1% to about 40%, for example from about 2% to about 39%, for example from about 3% to about 38%, for example from about 4% to about 37%, for example from about 5% to about 36%, for example from about 6% to about 35%, for example from about 7% to about 34%, for example from about 8% to about 33%, for example from about 9% to about 32%, for example from about 10% to about 31%, for example from about 11% to about 30%, for example from about 12% to about 29%, for example from about 13% to about 28%, for example from about 14% to about 27%, for example from about 15% to about 26%, for example from about 16% to about 25%, for example from about 17% to about 24%, for example from about 18% to about 23%, for example from about 19% to about 22%, for example from about 20% to about 21%, or any wt. % or any range derivable therein.

In an aspect, the present disclosure relates to ternary blends comprising a donor:acceptor ratio (w/w) ranging from about 1:1.0 to about 1:2.0, for example from about 1:1.1 to about 1:1.9, for example from about 1:1.2 to about 1:1.8, for example from about 1:1.3 to about 1:1.7, for example from about 1:1.4 to about 1:1.6, or any range derivable therein. In a particular embodiment, the ternary blend comprises a donor:acceptor ratio (w/w) of about 1:1.5.

In particular embodiments of the present disclosure, more specifically with reference to spin coated active layers, improved PCEs were obtained for the ternary blends relative to the binary blends (7.9% vs 7% respectively). Moreover, improved PCEs were also obtained for the ternary blends relative to the binary blends when active layer processing was carried out using slot-die coating (7.7% vs 6.8% respectively). In particular embodiments of the present disclosure, under low-light intensity using LED illumination (2000 lux), slot-die coated ternary devices showed PCEs of 14.0% compared to 12.0% for the binary devices. Moreover, spin coated ternary devices fabricated from FBT optimized batches showed PCEs of 15.5% compared to PCEs of 13.1% for binary devices under the same illumination conditions.

The slot-die coated ternary devices, when examined under ambient conditions and thermal stress, showed stable device performance. With a $V_{oc}$ increase due to PDI incorporation, and a $V_{oc}$ loss<0.17 V under low light intensity, the $FBT:PC_{61}BM:PDI$ ternary system represents a useful system for slot-die coated iOPVs.

In order to further enhance and optimize device performance, as well as reproducibility and stability, a ZnO/PEIE bilayer was tested as the electron transport layer (ETL). A spin coated active layer comprising an optimized ternary blend was used to determine the effect of the PEIE on the device performance. It was determined that the ZnO/PEIE bilayer gave better device performance and consistency compared to a ZnO only layer (Table 3).

TABLE 3

Photovoltaic metrics for devices with spin coated binary and ternary active layers comprising either a ZnO layer or a ZnO/PEIE bilayer under 1 sun illumination.

| Condition | $V_{oc}$ (V) | $J_{sc}$ ($\mu A/cm^2$) | FF % | PCE % |
|---|---|---|---|---|
| | | ZnO | | |
| Binary [a] | 0.76 (0.76) | 13 (12.7) | 72 (72) | 7.1 (6.9) |
| Ternary [a] | 0.83 (0.83) | 13.2 (12.9) | 69 (69) | 7.6 (7.4) |
| Binary [b] | 0.76 (0.76) | 12.5 (12.4) | 73 (73) | 7.0 (7.0) |
| Ternary [b] | 0.86 (0.86) | 13.4 (13.2) | 68 (68) | 7.9 (7.8) |
| | | ZnO/PEIE | | |
| Binary [a] | 0.77 (0.76) | 13.1 (12.4) | 74 (73) | 7.4 (7) |
| Ternary [a] | 0.85 (0.85) | 13.4 (12.8) | 73 (72) | 8.3 (7.9) |
| Binary [b] | 0.79 (0.78) | 12.74 (12.6) | 74 (72) | 7.4 (7.1) |
| Ternary [b] | 0.86 (0.86) | 13.2 (12.9) | 69 (69) | 7.9 (7.6) |

Device architecture: glass/ITO/ZnO or (ZnO/PEIE)/active layer/$MoO_x$/Ag

Devices spin coated from o-xylene containing 1% AA additive, 20 mg/mL total concentration and (1:1.5) $D:A_1:A_2$ ratio (D: FBT, $A_1$: $PC_{61}BM$, and $A_2$: PDI).

The values of the best device are reported, while the values in parentheses represent the average PCEs from over 15 devices with 0.14 $cm^2$ active area.

[a] FBT prepared in accordance with literature procedures.

[b] FBT provided by Brilliant Matters.

Optimized ternary blends (20 wt. % PDI) and $FBT:PC_{61}BM$ binary blends were fabricated using slot-die coating and the optimized ZnO/PEIE bilayer was tested as the ETL. Under 1 sun illumination, the slot-die coated ternary devices yielded a PCE of 7.7% and the following photovoltaic parameters: $J_{sc}$=12.9 mA/cm$^2$; $V_{oc}$=0.86 V; and FF=69%. The binary blends yielded a PCE of 6.8% and the following photovoltaic parameters: $J_{sc}$=12.3 mA/cm$^2$; $V_{oc}$=0.78 V; and FF=71%) (Table 4). Optimized spin coated ternary and binary devices are also shown in Table 4. Interestingly, transitioning from spin coating to slot-die coating showed no loss in device performance (PCE of 7.9% for spin coated devices vs. PCE of 7.7% for slot-die coated devices) for ternary blend systems. However, for the binary devices, transitioning from spin coating to slot-die coating results in a loss of device performance (PCE of 7.4% for spin coated devices vs. PCE of 6.8% for slot-die coated devices), suggesting that the ternary blend is also a more viable system for scaling. For active layers slot-die coated in air, and processed from halogen-free solvents, this device performance is the highest yet for FBT-based OPVs.

TABLE 4

Photovoltaic metrics for devices with spin coated and slot die-coated binary and ternary active layers under 1 sun illumination.

| Condition [1, 2] | $V_{oc}$ (V) [3] | $J_{sc}$ (mA/cm$^2$) [3] | FF (%) [3] | PCE (%) [3] |
|---|---|---|---|---|
| Spin coated (SC)-Binary | 0.79 (0.78) | 12.74 (12.6) | 74 (72) | 7.4 (7.1) |
| Slot-die coated (SD)-Binary | 0.78 (0.77) | 12.3 (12.3) | 71 (70) | 6.8 (6.7) |
| Spin coated (SC)-Ternary | 0.86 (0.86) | 13.2 (12.9) | 69 (69) | 7.9 (7.6) |
| Slot-die coated (SD)-Ternary | 0.86 (0.86) | 12.9 (13.0) | 69 (65) | 7.7 (7.4) |

[1] Device architecture: glass/ITO/ZnO/PEIE/active layer/$MoO_x$/Ag

[2] Devices processed from o-xylene containing 1% AA additive, 20 mg/mL total concentration and (1:1.5) D:$A_1$:$A_2$ ratio (D: FBT, $A_1$: $PC_{61}BM$, and $A_2$: PDI).

[3] The values of the best device are reported, while the values in the parentheses stand for the average PCEs from over 15 devices with 0.14 cm$^2$ active area.

Devices with slot-die coated active layers (binary and ternary active layers) were subsequently examined under various LED illuminations (ca. 1000 and 2000 lux (288 and 568 μW/cm$^2$ respectively)) (FIG. 3*b*). The device parameters are listed in Table 5. Under low-light intensity, the devices with slot-die coated ternary active layers exhibited a PCE of 14%, a $J_{sc}$ of 153 μA/cm$^2$, and a maximum power density of 79 μW/cm$^2$. As expected, at lower light intensities, the $V_{oc}$ dropped in devices based on both binary (from 0.78 to 0.63 V) and ternary (from 0.86 to 0.72 V) blends compared to the values under 1 sun illumination (Table 4). However, the $V_{oc}$ drop for devices based on ternary blends was compensated by higher initial $V_{oc}$ values resulting from the PDI contribution, which also enhanced the overall PCE from 12.0% for binary to 14.0% for ternary devices (Table 5).

TABLE 5

Photovoltaic metrics for devices with spin coated and slot-die-coated binary and ternary active layers under different warm LED (2700 K) indoor light illumination intensities.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Slot-die coated Binary[a] | | | | | |
| 288 | 0.60 (0.60) | 80.1 (79.2) | 68 (67) | 11.4 (11.1) | 32.7 (31.8) |
| 568 | 0.63 (0.63) | 154 (147.0) | 70 (68) | 12.0 (11.1) | 67.9 (63.0) |
| Slot-die coated Ternary[a] | | | | | |
| 288 | 0.69 (0.69) | 77.7 (77.7) | 70 (67) | 13.0 (12.5) | 37.5 (36.0) |
| 568 | 0.72 (0.72) | 153 (150) | 72 (70) | 14.0 (13.3) | 79.3 (75.6) |

TABLE 5-continued

Photovoltaic metrics for devices with spin coated and slot-die-coated binary and ternary active layers under different warm LED (2700 K) indoor light illumination intensities.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Spin coated Binary[b] | | | | | |
| 288 | 0.61 (0.60) | 86.2 (81) | 70 (69) | 12.8 (11.6) | 36.8 (33.5) |
| 568 | 0.63 (0.63) | 162.4 (154) | 73 (73) | 13.1 (12.5) | 74.7 (70.8) |
| Spin coated Ternary[b] | | | | | |
| 288 | 0.69 (0.68) | 87.3 (83.5) | 70 (69) | 14.6 (13.6) | 42.1 (39.2) |
| 568 | 0.72 (0.72) | 167.4 (159) | 73 (71) | 15.5 (14.3) | 88.0 (81.3) |

Device architecture: glass/ITO/ZnO/PEIE/active layer/$MoO_x$/Ag

Devices processed from o-xylene containing 1% AA additive, 20 mg/mL total concentration and (1:1.5) $D:A_1:A_2$ ratio (D: FBT, $A_1$: $PC_{61}BM$, and $A_2$: PDI).

The values of the best device are reported, while the values in the parentheses stand for the average PCEs from over 15 devices with 0.14 cm$^2$ active area.

[a]FBT supplied by Brilliant Matters.

[b]FBT prepared in accordance with literature procedures.

Utilizing an optimized batch of FBT in the ternary devices (Table 3), a PCE of 15.5%, under 2000 lux illumination (ca. 568 μW/cm$^2$), was achieved for devices using a spin coated ternary system, relative to a PCE of 13.1% for devices using a spin coated binary system (Table 5, FIG. 6*c*). The devices based on slot-die coated ternary blends, using the optimized FBT, achieved output powers of 79.0 and 37.5 μW/cm$^2$ at input powers of 568 and 288 μW/cm$^2$ respectively (ca. 2000 and 1000 lux warm LED light respectively; Table 5), resulting in PCEs of 14% and 13%, respectively. The devices based on spin coated ternary blends, using the optimized FBT, achieved output powers as high as 88.0 and 42.1 μW/cm$^2$ at input powers of 568 and 288 μW/cm$^2$ respectively (ca. 2000 and 1000 lux warm LED light respectively; Table 5), resulting in PCEs of 15.5% and 14.6%, respectively. Tables 6 and 7 and the associated J-V curves illustrated in FIGS. 8 and 9, provide additional photovoltaic parameters for spin coated films under different low light intensities.

TABLE 6

Photovoltaic metrics for devices with spin coated binary and ternary active layers under different warm indoor light illumination intensities.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Binary (ZnO) | | | | | |
| 113 | 0.55 (0.55) | 34.5 (34.5) | 68 (67) | 11.4 (11.3) | 12.9 (12.7) |
| 288 | 0.58 | 86.2 | 68 | 11.8 | 34 |
| 568 | 0.61 (0.61) | 170.4 (169.3) | 70 (69) | 12.8 (12.5) | 72.8 (71.3) |
| Ternary (ZnO) | | | | | |
| 113 | 0.62 (0.62) | 34.5 (33.5) | 67 (68) | 12.7 (12.5) | 14.3 (14.1) |
| 288 | 0.65 | 88.4 | 66 | 13.2 | 37.9 |
| 568 | 0.68 (0.68) | 161.1 (163) | 70 (68) | 13.5 (13.3) | 76.7 (75.4) |

Device architecture: glass/ITO/ZnO/active layer/$MoO_x$/Ag

Devices spin coated from o-xylene containing 1% AA additive, 20 mg/mL total concentration and (1:1.5) $D:A_1:A_2$ ratio (D: FBT, $A_1$: $PC_{61}BM$, and $A_2$: PDI). FBT polymer prepared in accordance with literature procedures The values of the best device are reported, while the values in the parentheses stand for the average PCEs from over 15 devices with 0.14 cm$^2$ active area.

TABLE 7

Photovoltaic metrics for devices with spin coated binary and ternary active layers under different warm indoor light illumination intensities.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Binary (ZnO/PEIE) | | | | | |
| 113 | 0.57 (0.57) | 35.1 (33.2) | 70 (69) | 12.4 (11.6) | 14.0 (13.1) |
| 288 | 0.61 (0.60) | 86.2 (81) | 70 (69) | 12.8 (11.6) | 36.8 (33.5) |
| 568 | 0.63 (0.63) | 162.4 (154) | 73 (73) | 13.2 (12.5) | 74.7 (70.8) |

TABLE 7-continued

Photovoltaic metrics for devices with spin coated binary and ternary active layers under different warm indoor light illumination intensities.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Ternary (ZnO/PEIE) | | | | | |
| 113 | 0.66 (0.65) | 35.9 (34.4) | 69 (68) | 14.4 (13.5) | 16.3 (15.2) |
| 288 | 0.69 (0.68) | 87.3 (83.5) | 70 (69) | 14.6 (13.6) | 42.2 (39.2) |
| 568 | 0.72 (0.72) | 167.4 (159) | 73 (71) | 15.5 (14.3) | 88.0 (81.3) |

Device architecture: glass/ITO/ZnO/PEIE/active layer/$MoO_x$/Ag

Devices spin coated from o-xylene containing 1% AA additive, 20 mg/mL total concentration and (1:1.5) D:$A_1$:$A_2$ ratio (D: FBT, $A_1$: $PC_{61}BM$, and $A_2$: PDI). FBT polymer prepared in accordance with literature procedures.

The values of the best device are reported, while the values in the parentheses stand for the average PCEs from over 15 devices with 0.14 cm$^2$ active area.

A FBT:$PC_{61}BM$ binary system, processed using slot-die coating, having a PCE of ~14% (output power of 41 μW/cm$^2$ at input power of 310 μW/cm$^2$; 1000 lux) has recently been reported.[15] A related FBT:$PC_{71}BM$ binary system, processed via spin coating using halogenated solvents (e.g. chlorobenzene), having a PCE of 16% (output power 45 μW/cm$^2$ at input power of 280 μW/cm$^2$; 1000 lux) has also been reported.[8] Moreover, a related ternary system comprising EP-PDI as the third component [PTB7:$PC_{71}BM$:EP-PDI], achieving a device PCE of 15.7% under 500 lux (ca. 170 μW/cm$^2$) for spin-coated active layers processed from halogenated solvents (chlorobenzene+3% 1,8-diiodooctane) has also reported.[17] As described in the present disclosure, it has been discovered that, not only do PCEs for ternary systems reach 14% using both slot-die coating in air and non-halogenated solvents, but also higher $V_{oc}$ values (0.72 V) with low $V_{oc}$ losses (<0.17 V) under low-light intensities can be achieved relative to the $V_{oc}$ values of 0.62, 0.59 and 0.65 V, reported by the aforementioned studies.[8,15,17]

The intermolecular spacings of the semicrystalline regions of the neat donor and acceptor materials, as well as the blended films, were investigated using grazing incidence wide-angle x-ray scattering (GIWAXS). FIG. 10*a* illustrates 2-D detector images for spin coated and slot-die coated binary and ternary blends. 2-D detector images for FBT, $PC_{61}BM$, and PDI are illustrated in FIGS. 11, 12 and 13 respectively. FIG. 10*b* illustrates the complementary one-dimensional GIWAXS plots with cake slices in the $q_z$ (out-of-plane) and $q_{xy}$ (in-plane) directions. The relative d-spacings calculated from FIG. 10*b*, including peak assignments, are depicted in Table 8. With reference to FIG. 10*b*, the neat FBT polymer (blue curve) exhibits a lamellar intermolecular spacing in the out-of-plane $q_z$ (100) corresponding to a d-spacing of 20.27 Å, with two higher-order diffraction peaks associated with the (200) and (300) planes. A peak in the out-of-plane direction, that has been attributed to the (010) plane associated with the π-π stacking direction (d-spacing of 3.61 Å), was also observed. All peaks could also be observed in the in-plane direction, although at lower intensity. $PC_{61}BM$ showed the characteristic isotropic peaks corresponding to d-spacings of 8.73 Å (n=1) and 4.52 Å (n=2) respectively, consistent with previous reports. PDI primarily showed a strong intermolecular spacing of 14.96 Å, that was dominant in the out-of-plane direction, and also showed isotropic behavior.

TABLE 8

Intermolecular spacings (Å) of the semi-crystalline regions in neat and blend films from the peaks of the $q_z$-space in FIG. 10b.

| | d-spacing (Å) | | | | | | |
|---|---|---|---|---|---|---|---|
| | FBT | | | | $PC_{61}BM$ | | |
| Sample | (100) | (200) | (300) | (010) | (n = 1) | (n = 2) | PDI |
| FBT | 20.27 | 9.97 | 6.68 | 3.61 | — | — | — |
| $PC_{61}BM$ | — | — | — | — | 8.73 | 4.52 | — |
| PDI | — | — | — | — | — | — | 14.96 |
| Binary SD | 19.04 | 9.52 | 6.54 | 3.61 | 8.61 | 4.49 | — |
| Binary SC | 19.04 | 9.67 | 6.54 | 3.61 | — | 4.52 | — |
| Ternary SD | 19.04 | 9.67 | 6.54 | 3.61 | — | 4.49 | — |
| Ternary SC | — | 9.38 | — | — | — | — | — |

The binary blend of FBT:$PC_{61}BM$, both slot-die-coated and spin coated, exhibit the (100), (200), (300), and (010) peaks associated with FBT and the two (n=1, 2) isotropic peaks of $PC_{61}BM$. As listed in Table 8, the intermolecular spacings associated with the lamellar stacking direction in FBT are reduced slightly from neat FBT to the binary blends. The binary blends are effectively the linear combination of the FBT and $PC_{61}BM$ intermolecular spacings, implying the crystalline presence of both materials, but with a closer packed lamellar FBT.

The slot-die-coated ternary blend also exhibits the same peaks associated with FBT and $PC_{61}BM$, but there is no evidence of the isotropic 15.31 Å spacing of PDI. The spin coated ternary blend however does not appear to have any notable intermolecular spacing besides a weak FBT (200). The implications of these ternary results are that i) slot-die-coating allows enough relaxation time for the materials to crystallize; ii) PDI intercalates into the FBT and $PC_{61}BM$ and prevents crystallization when spin coated; and iii) in slot-die-coating, FBT and $PC_{61}BM$ segregate from the PDI with enough time for reorganization and form domains, but the PDI remains amorphous. While the GIWAXS data reveals slightly different active layer morphologies, owing to the different compositions and processing methods, all PCEs remain similar implying somewhat insensitive BHJ active layers, which is favorable for upscaling. This is consistent with previous reports for the FBT polymer having thickness independent performance (PCE of 15.1% achieved under 1000 lux for 500 nm thickness spin coated active layers).[8]

The light-soaking effect is commonly observed in inverted OPVs with metal oxides such as ZnO and $TiO_2$ as electron transport layers. Device performance (particularly FF) was observed to enhance gradually with increasing light exposure time (under 1 sun illumination or ultraviolet light) until it reaches a saturation maximum. The origin of this light-soaking effect is not yet clear. However, it is generally attributed to the presence of trap sites in the metal-oxide surface that lead to a potential barrier at the ITO/metal-oxide interface, and an energy level mismatch at the metal-oxide/active layer interface that adversely affects device performance. Although this effect was not observed in the devices of the present disclosure under 1 sun illumination, it was however observed under low light LED illumination (Table 9; and FIG. 14).

TABLE 9

Light soaking effect under various conditions on photovoltaic metrics.

| Condition | Pin (μW/cm$^2$) | $V_{oc}$ (V) | $J_{sc}$ (μA/cm$^2$) | FF % | PCE % | Pout (μW/cm$^2$) |
|---|---|---|---|---|---|---|
| W/O light soaking (LS) | 568 | 0.71 | 133 | 40 | 6.7 | 38 |
| LS with UV filter | 568 | 0.71 | 166 | 44 | 9.1 | 52 |
| LS-W/O UV filter | 568 | 0.71 | 169 | 70 | 14.8 | 84 |

Device architecture: glass/ITO/ZnO/PEIE/active layer/$MoO_x$/Ag

Devices spin coated from o-xylene containing 1% AA additive, 20 mg/ml total concentration and (1:1.5)

$D:A_1:A_2$ ratio (D: FBT (optimized batch), $A_1$: $PC_{61}BM$, and $A_2$: PDI).

The optimized devices, based on ternary blend active layers without light soaking, showed a dramatic loss in FF (40%) under low light intensity (2000 lux) compared to devices with light soaking (FF=70%). This effect was attributed to the lack of a UV portion in the LEDs source, which is needed for the devices to work properly. To confirm this hypothesis, a 400 nm UV filter (ThorLabs—FGL400S2 Square GG400 Colored Glass Filter, 400 nm Longpass) was used during the light soaking step to cut the UV portion from the 1 sun light source. Light soaking with the UV filter resulted in a low FF (44%), similar to the device FF without light soaking. This effect was observed in all devices with a ZnO electron transport layer (Table 10 and FIG. 15). Although the use of PEIE as the electron transport layer (ITO/PEIE/binary active layer/MoOx/Ag) did not require a light soaking step, it showed a lower performance (PCE=10.3%) when compared to the ZnO and ZnO/PEIE interlayers (PCE=12%).

TABLE 10

Light soaking effect on photovoltaic metrics for devices using different electron transporting layers.

| $P_{in}$ (μW/cm$^2$) | $V_{oc}$ (V) | $J_{sc}$ (μA/cm$^2$) | FF (%) | PCE (%) | $P_{out}$ (μW/cm$^2$) |
|---|---|---|---|---|---|
| Binary (ZnO/PEIE), light soaking required | | | | | |
| 568 (w) | 0.63 (0.63) | 154 (147) | 70 (68) | 12.0 (11.1) | 68 (63) |
| Binary (ZnO), light soaking required | | | | | |
| 568 (w) | 0.61 (0.61) | 164.2 (155.3) | 68.0 (65) | 12.0 (10.8) | 68.1 (61.6) |
| Binary (PEIE), NO light soaking required | | | | | |
| 568 (w) | 0.57 (0.55) | 163 (160.5) | 63 (58) | 10.3 (9.0) | 58.5 (51.2) |

Device architecture: glass/ITO/ ZnO or (ZnO/PEIE) or PEIE/active layer/$MoO_x$/Ag Devices slot-die coated from o-xylene containing 1% AA additive, 20 mg/mL total concentration and (1:1.5).

The values of the best device are reported, while the values in the parentheses stand for the average PCEs from over 15 devices with 0.14 cm$^2$ active area.

The stability of OPVs is a key issue towards the transition from lab to fab. The stability of the devices with slot-die coated ternary blend active layers under different conditions was investigated. Three similar sets of devices were prepared and examined under three different conditions: (1) under inert atmosphere in a nitrogen-filled glovebox; (2) under ambient conditions at room temperature and 30% relative humidity; and (3) under thermal stress in a nitrogen-filled glovebox under continuous heating at 80° C. (FIG. 16). All devices were unencapsulated and kept under dark conditions. The stability test was conducted at regular intervals over the course of 500 hours. OPV devices are characterized by the lifetime parameter Ts80, which is extracted from the time point at which the PCE drops to 80% of its value after the burn-in deterioration period.[18] The performance dropped to 80% of its initial value, following the burn-in deterioration period, after 500 hours for devices kept in a nitrogen-filled glovebox (FIG. 16*a*). Devices kept under ambient conditions were determined to have a Ts80 of 300 hours (FIG. 16*b*). However, devices subjected to thermal stress were determined to rapidly deteriorate with the PCE dropping to 78% of its initial value following the burn-in deterioration period, after only 30 minutes of heating (FIG. 16*c*). Interestingly, the PCE only dropped to 71% of its initial value after 300 hours of thermal stress, showing good stability (FIG. 16*c*). The ternary blends of the present disclosure, as exemplified by the FBT:$PC_{61}$BM:PDI blend, were shown to exhibit greater stability when compared to previous stability studies regarding the binary FBT:$PC_{71}$BM blend. Moreover, consistent with previous studies, the ternary blends of the present disclosure, as exemplified by the FBT:$PC_{61}$BM:PDI blend, appear to have a positive impact on the morphological stability under thermal stress, resulting in enhanced overall device stability.

TABLE 11

Photovoltaic metrics for devices with spin coated ternary (FBT:$PC_{61}$BM:BTP) active layers under 1 sun illumination.

| FBT:$PC_{61}$BM:BTP [1, 2] | $V_{oc}$ (V) | $J_{sc}$ (mA/cm$^2$) | FF (%) | PCE (%) |
|---|---|---|---|---|
| 1:1.35:0.15 | 0.82 | 15.3 (13.2) | 70 | 8.8 |
| 1:1.30:0.25 | 0.82 | 16.9 | 68 | 9.4 |
| 1:1.30:0.30 | 0.81 | 17.6 | 68 | 9.7 |
| 1:1.30:0.40 | 0.83 | 16.6 | 68 | 9.2 |
| 1:1.20:0.40 | 0.82 | 17.3 | 65 | 9.3 |

[1] Device architecture: glass/ITO/ZnO/PEIE/active layer/$MoO_x$/Ag
[2] Devices spin coated from o-xylene containing 1% AA additive

EXPERIMENTAL

A number of non-limiting examples are provided in the following sections, illustrating the preparation of binary and tertiary blends, and devices comprising same, in accordance with various embodiments of the present disclosure. The following non-limiting examples are illustrative of the present disclosure.

Materials and Solution Preparation

The polymer PPDT2FBT (FBT) was provided by Brilliant Matters, Quebec City. $PC_{61}$BM was purchased from Ossila. $tPDI_2N$-EH (PDI) was synthesized following published procedures.[15] Blends comprising FBT and $PC_{61}$BM (1:1.5 w/w and total concentration of 20 mg/mL) were dissolved in o-xylene with 1% (v/v) p-anisaldehyde (AA) as solvent additive. PDI was added as a third component to form the ternary blend (FBT:$PC_{61}$BM:PDI) with weight ratios of (1:1.35:0.15), (1:1.2:0.3), (1:1.05:0.45), (1:0.9:0.6), (1:0.75: 0.75). All solutions were heated at 60° C. with continuous stirring in air overnight prior to device fabrication. ZnO precursor solutions were prepared following the sol-gel method.[43] Polyethylenimine ethoxylated (PEIE; 35-40 wt. % in water) was prepared with a final concentration of 0.1 wt. % in 2-methoxyethanol.

Device Fabrication

An inverted type device structure of glass/ITO/ZnO or (ZnO/PEIE)/active layer/$MoO_x$/Ag was used. Devices were fabricated using ITO-coated glass substrates cleaned by sequentially ultra-sonicating with detergent and de-ionized water, acetone, and isopropanol, followed by UV/ozone cleaning for about 30 min. A room temperature ZnO solution was spin coated at about 4500 rpm and then annealed at about 200° C. in a purge box for about 30 min. A solution of 0.1 wt. % PEIE in 2-methoxyethanol was spin coated over the ZnO layer at about 5000 rpm followed by substrate annealing at about 110° C. for about 10 min. For spin coated devices, the active layer solution was coated at room temperature at different spin speeds for about 60 s. For slot-die coated devices, the active layer solution was coated on top of ZnO/PEIE bilayer using a compact sheet coater from FOM Technologies equipped with a 13 mm wide slot-die head using a solution dispense rate of 25 μL/min and a substrate motion speed of 20 cm/min. The substrates with the cast active layers were kept in a nitrogen-filled glovebox overnight before evaporating 10 nm $MoO_x$ and 100 nm Ag under $1\times10^{-5}$ Torr. The active area of the devices was defined by a shadow mask (0.14 cm$^2$).

Device Characterization

UV-Vis absorption spectra were recorded using an Agilent Technologies Cary 60 UV-vis spectrometer at room temperature. Atomic Force Microscopy (AFM) images were acquired using a TT-2 AFM (AFM Workshop, USA) in the tapping mode and WSxM software with a 0.01-0.025 Ohm/cm Sb (n) doped Si probe with a reflective back side aluminum coating. Photoluminescence (PL) spectra were recorded using an Agilent Technologies Cary Eclipse fluorescence spectrophotometer at room temperature. The current density-voltage (J-V) curves were measured using a Keithley 2420 source measure unit. The photocurrent was measured under AM 1.5 illumination at 100 mW/cm$^2$ (Newport 92251A-1000 Solar Simulator). A standard silicon solar cell (Newport 91150V) was used to calibrate light intensity. External Quantum Efficiencies (EQE) were measured in a QEX7 Solar Cell Spectral Response/QE/IPCE Measurement System (PV Measurement, Model QEX7, USA) with an optical lens to focus the light into an area about 0.04 cm$^2$ smaller than the dot cell. The silicon reference cell was used to calibrate the EQE measurement system in the wavelength range from 300 to 1100 nm. For indoor testing, a Coidak bulb was used as the illumination source. For the light soaking step, the devices were kept for 30 seconds under AM 1.5 illumination at 100 mW/cm$^2$ (Newport 92251A-1000 Solar Simulator), then directly measured under different indoor light intensities (2000, 1000 and 400 lux). The power and light intensities of both 1 sun and low light were calibrated using a standard mono-silicon solar cell (Oriel, Model 91150V, Newport).

Grazing Incidence Wide Angle X-Ray Scattering (GIWAXS)

GIWAXS experiments were carried out on beamline 11-3 at the Stanford Synchrotron Radiation Lightsource (SSRL), equipped with a two-dimensional Rayonix MX225 CCD area detector. The incident angle of measurement was ~0.11-0.12° and the beam energy was kept at 12.7 keV. A LaB6 standard sample was used to calibrate the wavelength and sample-detector distance. The obtained two-dimensional images were converted from intensity versus pixel position to intensity versus reciprocal space (q-space) using WARS tools and Nika macros in Igor 6.37. Two-dimensional images were reduced to one-dimensional intensity versus $q_z$- and $q_{xy}$-space by integration of cake segments taken from chi of 0-15° and 73-88°, respectively.

While the present disclosure has been described with reference to specific examples, it is to be understood that the disclosure is not limited to the disclosed examples. To the contrary, the disclosure is intended to cover various modifications and equivalent arrangements included within the spirit and scope of the appended claims.

All publications, patents and patent applications cited in the present disclosure are herein incorporated by reference in their entirety to the same extent as if each individual publication, patent or patent application was specifically and individually indicated to be incorporated by reference in its entirety.

REFERENCES

1. Steim, R.; Ameri, T.; Schilinsky, P.; Waldauf, C.; Dennler, G.; Scharber, M.; Brabec, C. J. Organic Photovoltaics for Low Light Applications. *Sol. Energy Mater. Sol. Cells* 2011, 95 (12), 3256-3261.
2. Freitag, M.; Teuscher, J.; Saygili, Y.; Zhang, X.; Giordano, F.; Liska, P.; Hua, J.; Zakeeruddin, S. M.; Moser, J.-E.; Gratzel, M.; Hagfeldt, A. Dye-Sensitized Solar Cells for Efficient Power Generation under Ambient Lighting. *Nat. Photonics* 2017, 11 (6), 372-378.
3. Chen, C.-Y.; Lee, W.-H.; Hsiao, S.-Y.; Tsai, W.-L.; Yang, L.; Lin, H.-L.; Chou, H.-J.; Lin, H.-W. Vacuum-Deposited Perovskite Photovoltaics for Highly Efficient Environmental Light Energy Harvesting. *J. Mater. Chem. A* 2019, 7 (8), 3612-3617.
4. Ding, Z.; Zhao, R.; Yu, Y.; Liu, J. All-Polymer Indoor Photovoltaics with High Open-Circuit Voltage. *J. Mater. Chem. A* 2019.
5. Cui, Y.; Yao, H.; Zhang, J.; Xian, K.; Zhang, T.; Hong, L.; Wang, Y.; Xu, Y.; Ma, K.; An, C.; He, C.; Wei, Z.; Gao, F.; Hou, J. Single-Junction Organic Photovoltaic Cells with Approaching 18% Efficiency. *Adv. Mater.* 2020, 32, 1908205.
6. Farahat, M. E.; Perumal, P.; Budiawan, W.; Chen, Y.-F.; Lee, C.-H.; Chu, C.-W. Efficient Molecular Solar Cells Processed from Green Solvent Mixtures. *J. Mater. Chem. A* 2017, 5 (2), 571-582.
7. Wai Ho, J. K.; Yin, H.; Kong So, S. From 33% to 57%—an Elevated Potential of Efficiency Limit for Indoor Photovoltaics. *J. Mater. Chem. A* 2020, 8 (4), 1717-1723.
8. Shin, S.-C.; Koh, C. W.; Vincent, P.; Goo, J. S.; Bae, J.-H.; Lee, J.-J.; Shin, C.; Kim, H.; Woo, H. Y.; Shim, J. W. Ultra-Thick Semi-Crystalline Photoactive Donor Polymer for Efficient Indoor Organic Photovoltaics. *Nano Energy* 2019, 58, 466-475.
9. Dayneko, S. V.; Hendsbee, A. D.; Welch, G. C. Combining Facile Synthetic Methods with Greener Processing for Efficient Polymer-Perylene Diimide Based Organic Solar Cells. *Small Methods* 2018, 2 (6), 1800081.
10. Tintori, F.; Laventure, A.; Welch, G. C. Perylene Diimide Based Organic Photovoltaics with Slot-Die Coated Active Layers from Halogen-Free Solvents in Air at Room Temperature. *ACS Appl. Mater. Interfaces* 2019, 11 (42), 39010-39017.
11. Laventure, A.; Harding, C. R.; Cieplechowicz, E.; Li, Z.; Wang, J.; Zou, Y.; Welch, G. C. Screening Quinoxaline-Type Donor Polymers for Roll-to-Roll Processing Compatible Organic Photovoltaics. *ACS Appl. Polym. Mater.* 2019, 1 (8), 2168-2176.
12. Abd-Ellah, M.; Cann, J.; Dayneko, S. V.; Laventure, A.; Cieplechowicz, E.; Welch, G. C. Interfacial ZnO Modification Using a Carboxylic Acid Functionalized N-Annulated Perylene Diimide for Inverted Type Organic Photovoltaics. *ACS Appl. Electron. Mater.* 2019, 1 (8), 1590-1596.
13. Dayneko, S. V.; Hendsbee, A. D.; Cann, J.; Cabanetos, C.; Welch, G. C. Ternary Organic Solar Cells: Using Molecular Donor or Acceptor Third Components to Increase Open Circuit Voltage. *New J. Chem.* 2019, 43 (26), 10442-10448.
14. Dayneko, S. V.; Pahlevani, M.; Welch, G. C. Indoor Photovoltaics: Photoactive Material Selection, Greener Ink Formulations, and Slot-Die Coated Active Layers. *ACS Appl. Mater. Interfaces* 2019.
15. Dayneko, S. V.; Pahlevani, M.; Welch, G. C. Indoor Photovoltaics: Photoactive Material Selection, Greener Ink Formulations, and Slot-Die Coated Active Layers. *ACS Appl. Mater. Interfaces* 2019, 11 (49), 46017-46025.
16. Hendsbee, A. D.; Sun, J.-P.; Law, W. K.; Yan, H.; Hill, I. G.; Spasyuk, D. M.; Welch, G. C. Synthesis, Self-Assembly, and Solar Cell Performance of N-Annulated Perylene Diimide Non-Fullerene Acceptors. *Chem. Mater.* 2016, 28 (19), 7098-7109.
17. Singh, R.; Shin, S.-C.; Lee, H.; Kim, M.; Shim, J. W.; Cho, K.; Lee, J.-J. Ternary Blend Strategy for Achieving High-Efficiency Organic Photovoltaic Devices for Indoor Applications. *Chem. Euro. J.* 2019, 25 (24), 6154-6161.
18. Zhang, Y.; Samuel, I. D. W.; Wang, T.; Lidzey, D. G. Current Status of Outdoor Lifetime Testing of Organic Photovoltaics. *Adv. Sci.* 2018, 5, 1800434.

The invention claimed is:

1. A ternary blend or a composition comprising the ternary blend, wherein the blend comprises two electron acceptor materials $A_1$ and $A_2$, and an electron donor material $D_1$, wherein the electron donor material $D_1$ is poly[(2,5-bis(2-hexyldecyloxy) phenylene)-alt-(5,6-difluoro-4,7-di(thiophen-2-yl)benzo[c][1,2,5]thiadiazole)] (PPDT2FBT), and wherein one of the two electron acceptor materials $A_1$ and $A_2$ is an alkyl-12,13-dihydro[1,2,5] thiadiazolo[3,4e]thieno[2",3":4',5'] thieno[2',3':4,5] pyrrolo[3,2-g] thieno [2',3':4,5] thieno[3,2-b]indole-2,10-diyl)bis(methanylylidene)) bis(3-oxo-2,3-dihydro1H-indene-2,1-diylidene)) dimalononitrile) (BTP)-based electron acceptor material.

2. The ternary blend or composition of claim 1, wherein the blend comprises a mass ratio (w/w) of donor material to acceptor material ranging from about 1:1.0 to about 1:2.0.

3. The ternary blend or composition of claim 1, wherein the blend comprises FBT:$PC_{61}$BM:BTP.

4. The ternary blend or composition of claim 3, wherein the mass ratio (w/w) of FBT:$PC_{61}$BM:BTP is about 1:1.2:0.3.

5. The ternary blend or composition of claim 3, wherein the mass ratio (w/w) of FBT:$PC_{61}$BM:BTP is about 1:1.05:0.45.

6. The ternary blend or composition of claim 3, wherein the mass ratio (w/w) of FBT:$PC_{61}$BM:BTP is about 1:0.9:0.6.

7. The ternary blend or composition of claim 3, wherein the mass ratio (w/w) of FBT:$PC_{61}$BM:BTP is about 1:1.35:0.15.

8. The ternary blend or composition of claim 1, wherein the blend further an additive.

9. The ternary blend or composition of claim 8, wherein the additive comprises from about 0.1 wt. % to about 5.0 wt. % of the blend.

10. The ternary blend or composition of claim 8, wherein the additive comprises at least one of p-anisaldehyde (AA) or diphenyl ether (DPE).

11. The ternary blend or composition of claim 1, wherein the blend is slot-die coated, or spin coated.

12. The ternary blend or composition of claim 11, wherein the blend is slot-die coated, or spin coated from a halogen-free solvent.

13. The ternary blend or composition of claim 1, wherein the blend is provided in the form of a bulk material or a film.

14. An optical or electronic device comprising the ternary blend or composition of claim 1.

15. The device of claim 14, wherein the device further comprises an anode and a cathode.

16. The device of claim 15, wherein the device comprises an active layer between the anode and the cathode.

17. The optical or electronic device of claim 14, wherein the device is a photovoltaic cell, an organic transistor, a light emitting diode, a photodetector.

18. An organic semiconductor material, layer or component, comprising the ternary blend or composition of claim 1.

19. A printing ink comprising the ternary blend or composition of claim 1.

20. The printing ink of claim 19, wherein the printing comprises inkjet printing, screen printing, flexographic printing, offset printing and rotogravure printing.

* * * * *